United States Patent [19]
deRochemont et al.

[11] Patent Number: 6,027,826
[45] Date of Patent: Feb. 22, 2000

[54] METHOD FOR MAKING CERAMIC-METAL COMPOSITES AND THE RESULTING COMPOSITES

[75] Inventors: Pierre L. deRochemont, Hampton, N.H.; Daniel E. Ryder, Fiskdale, Mass.; Michael J. Suscavage, Shirley, Mass.; Mikhail Klugerman, Acton, Mass.

[73] Assignee: The United States of America as represented by the Secretary of the Air Force, Washington, D.C.

[21] Appl. No.: 08/538,264

[22] Filed: Oct. 2, 1995

Related U.S. Application Data

[63] Continuation-in-part of application No. 08/263,207, Jun. 16, 1994, abandoned.

[51] Int. Cl.[7] ............................ B32B 15/04; B32B 18/00; H01B 12/00; H01L 39/00
[52] U.S. Cl. .......................... 428/702; 428/379; 428/457; 428/697; 428/699; 428/701; 428/692; 428/928; 428/930; 174/125.1; 505/230; 505/232; 505/234; 505/236; 505/238; 505/430; 505/701; 156/89.11; 156/89.12; 156/292
[58] Field of Search ...................................... 428/457, 379, 428/381, 689, 697, 699, 701, 702, 928, 930, 692; 174/125.1; 505/230, 232, 234, 236, 238, 701, 430; 156/89.11, 89.12, 292

[56] References Cited

U.S. PATENT DOCUMENTS

| | | | |
|---|---|---|---|
| 5,071,828 | 12/1991 | Greuter et al. | 505/425 |
| 5,077,270 | 12/1991 | Takeda et al. | 505/237 |
| 5,096,878 | 3/1992 | Hoshino et al. | 505/434 |
| 5,104,849 | 4/1992 | Shiga et al. | 505/231 |
| 5,116,808 | 5/1992 | Belouet | 505/232 |
| 5,168,420 | 12/1992 | Ramesh et al. | 505/170 |
| 5,187,149 | 2/1993 | Jin et al. | 505/450 |
| 5,470,668 | 11/1995 | Wu et al. | 428/688 |
| 5,614,472 | 3/1997 | Riddle et al. | 505/425 |
| 5,707,715 | 1/1998 | de Rochemont et al. | 428/210 |

OTHER PUBLICATIONS

P. Arendt et al., "Highly–Textured Ti–Ba–Ca–Cu–O Polycrystalline Superconducting Films on Ag Substrates", *Science and Technology of Thin Film Superconductors 2*, (edited by McConnell and Noufi), pp. 47–56, 1990.

*Primary Examiner*—Marie Yamnitzky
*Attorney, Agent, or Firm*—Thomas C. Stover

[57] ABSTRACT

The invention provides methods to manufacture dense, complex c-axis oriented ceramic oxide layers with thickness greater than 2.5 microns ($\mu$m) on a metallic substrate (composites) without the use of an interfacial barrier, buffer, or surface layer using a metalorganic deposition process and thermomechanical reaction treatments is disclosed. A porous amorphous metal oxide ceramic deposit is formed directly on the substrate by spray pyrolyzing a mixed metalorganic precursor solution onto the metallic substrate. The metallic substrate has been previously heated to temperatures greater than the boiling point of the organic solvent and are high enough to initiate in situ decomposition of the metalorganic precursor salts. The process does not apply the precursor solution to the substrate as a liquid coating that is pyrolyzed in subsequent processing steps. The resultant porous amorphous oxide deposit is processed into a dense amorphous ceramic, or a fully crystallized c-axis oriented ceramic through a series of mechanical compression and short reaction treatments that are used to crystallize the amorphous ceramic layer. The inventive method applies to making complex ceramic oxides including superconducting compositions of bismuth cuprate ceramic, piezoelectric or insulating compositions. The composites so produced are useful in devices that include ceramic sputtering targets, heat shields, electrically conducting wires, magnetic solenoids, electromagnetic shielding, and energy storage devices. The invention also provides the ceramic-metal composites so made.

44 Claims, 11 Drawing Sheets

METHOD FOR MAKING CERAMIC-METAL COMPOSITES AND THE RESULTING COMPOSITES

This application is a continuation-in-part of co-pending parent application U.S. Ser. No. 08/263,207, filed Jun. 16, 1994, abandoned.

STATEMENT OF GOVERNMENT INTEREST

The invention described herein may be manufactured and used by or for the Government for governmental purposes without the payment of any royalty thereon.

FIELD OF THE INVENTION

This invention relates to ceramic-metal composites, particularly ceramics directly bonded to metal substrates and methods for making same.

BACKGROUND OF THE INVENTION

The term "complex oxide ceramic" is applied to compositional states of matter that are composed of two or more metal oxide components that have been reacted to form a solid contiguous mass of crystalline grains comprised in whole or in part of the metal oxide components. The term "ultrafine subdivision" is interpreted to mean a level of mixing among the metal oxide components in which each component metal oxide is broken from a particulate state to its irreducible molecular basis and homogeneously mixed with other components that have been so equally subdivided. The term "intermediate phases" is interpreted to mean those crystalline phases of a ceramic oxide with a complex bulk composition that must first be formed from an amorphous phase of the ceramic and subsequently reacted to form a single crystalline phase of the complex ceramic. The term "fully equilibrated" is interpreted to mean the state achieved when all the intermediate phases of a complex ceramic oxide have been reacted and fully dissolved into the single crystalline phase of the complex ceramic. The term "phase equilibration" is interpreted to mean the process by which a complex ceramic becomes fully equilibrated. The term "spray pyrolysis" is interpreted to mean the process by which a solid oxide is formed directly from an aerosol salt solution on the surface of heated substrate by thermally decomposing the salts on the substrate surface and simultaneously evaporating the solution solvent. The term "integral operating element" is interpreted to mean a component of a system, without which the system would fail to perform as designed. The term preform is interpreted to mean a structure of larger cross-sectional size containing a pattern or arrangement of distinct material compositions that is extruded or drawn into a structure of smaller cross-sectional size that contains the same relative pattern or arrangement of distinct material compositions as the larger structure but reduced in scale. The term "insulating ferroelectric ceramic" is applied to a class of ceramics that have strong dielectric properties. The term "electrically conductive ceramic" is applied to a class of ceramic that is capable of transporting electrical current, of which superconductors are a subset. The term "piezoelectric ceramic" is applied to ceramics that expand or contract in volume when under the influence of an electric field, or induce an electrical voltage when under the influence of mechanical stress. The term "magneto-sensitive ceramic" is applied to ceramics that exhibit altered physical properties, such as changes in their electrical resistance, or changes in their structural characteristics under the influence of an applied magnetic field. The term "thermally insulating ceramic" is applied to ceramics that impede the flow of heat through their bodies or over their surfaces. The term "superconductivity" is applied to the phenomenon of immeasurably low electrical resistance, simultaneously occurring with the onset of diamagnetism, exhibited by materials that have been cooled to temperatures below a critical transition-temperature ($T_c$) at which the material abruptly loses its electrical resistance and acquires diamagnetic properties not exhibited at temperatures above its $T_c$. $T_c$ is distinct to a superconducting material's chemical composition, and is often used to rank the superconductor on a scale of cryogenic suitability. Low-$T_c$ superconductors are usually metals with critical transition-temperatures of 23 K or less. High-$T_c$ superconductors are complex copper oxide ceramics with critical transition-temperatures that can be significantly above 23 K.

Complex ceramics are often classified in terms of crystallographic structure. Ceramics possessing the physical properties described above have either spinel-type, perovskite, ilmenite, crystallographic structures, or a crystallographic structure that is recognized as a derivative of said crystallographic structure. Spinel-type crystals have a general chemical formula of $AB_2O_4$, where O is an oxygen atom and A and B are metal atoms. In magnesium aluminate, $MgAl_2O_4$ (spinel), the oxygen ions are configured in face-centered cubic close packing structures. In a subcell of this structure there are four atoms, four octahedral interstices, and eight tetrahedral interstices. This makes a total of twelve interstices to be filled by the three cations, one divalent and two trivalent. Two types of spinel occur. In normal spinel the $A^{2+}$ ions are on tetrahedral sites and the $B^{3+}$ are on octahedral sites. Examples include $ZnFe_2O_4$, $CdFe_2O_4$, $MgAl_2O_4$, etc. In inverse spinels, the $A^{2+}$ and half of the $B^{3+}$ ions are on octahedral sites; the other half of the $B^{3+}$ are on tetrahedral sites, as a $B(AB)O_4$ crystal. This is a more common structure and used to classify the following types of ferrite crystals useful for their magnetic properties: such as, $FeMgFeO_4$, $FeTiFeO_4$, $Fe_3O_4$, $ZnSnZnO_4$, and $FeNiFeO_4$.

Most ceramic oxide structures are based on close packing of oxygen ions. Perovskite crystals contain large cations which form a close-packed structure along with the oxygen ions. In perovskite, $CaTiO_3$, the alkaline earth metal cations ($Ca^{2+}$) and the oxygen ($O^{2-}$) ions combine to form a close-packed cubic structure with a smaller, more highly charged transition-metal ($Ti^{4+}$) in octahedral interstices. Each $O^{2-}$ ion is surrounded by four alkaline earth metal cations ($Ca^{2+}$) and eight $O^{2-}$ ions; each alkaline earth metal cation ($Ca^{2+}$) is surrounded by twelve $O^{2-}$ ions. In the center of the face-centered cubic unit cell the small, highly charged transition-metal ion ($Ti^{4+}$) is octahedrally coordinated to six $O^{2-}$. Perovskite crystals may be simple structures with two metal oxide components, $CaTiO_3$, $SrTiO_3$, $BaTiO_3$, $SrSnO_3$, $LaAlO_3$, $CaZrO_3$, $SrZrO_3$, and $YAlO_3$; or they may be more complex blended structures: $(Ba,Sr)TiO_3$, $Pb(Zr,Ti)O_3$, $YBa_2Cu_3O_{7-\delta}$, $Bi_2Sr_2CaCu_2O_8$, or $Bi_{1.80}Pb_{0.40}Sr_{1.91}Ca_{2.03}Cu_{3.06}O_{10-\delta}$, et cetra.

The ilmenite, $FeTiO_3$, structure is a derivative of the corundum, $Al_2O_3$ or $Fe_2O_3$, structure. Derivative structures exhibit the symmetry and regularity of some simpler structure that has been perturbed to produce a more complex array of atoms. These perturbations include the ordered substitution of several different species of atoms, the ordered omission of atoms, the addition of an atom to an unoccupied site, and the distortion of the atomic array. In ilmenite, half the cation sites are occupied by $Fe^{3+}$ cations, the other half by $Ti^{4+}$ cations in alternate layers. This structure describes $MgTiO_3$, $NiTiO_3$ and $MnTiO_3$. $LiNbO_3$ is an example of a derivative structure in which each layer of cations contains an ordered arrangement of Li and Nb. High-$T_c$ ceramic superconductors may be considered as examples of derivative perovskite crystal structures in which cations have been arranged in organized layers.

Some of these ceramics do not naturally occur in nature. Many of these ceramics are found in nature. Technologically useful structures are made if these materials can be applied to metals and formed into mechanically workable sheets or elongated wire forms. The performance of a single such structure may be enhanced if it contains more than one type of such ceramic. High-$T_c$ superconductivity in the cuprate ceramics was first discovered in 1985. Since then, reports of high-$T_c$ superconductivity has been reported in chemical compositions that are now classified as rare-earth alkaline earth copper oxides ("RE-AE-Cu—O"):

P-1

J. G. Bednorz and K. A. Müller, "Possible High-$T_c$ Superconductivity in the Ba—La—Cu—O System", *Z. Phys. B.—Condensed Matter*, Vol. 64, pp. 189–193 (1986), which reveals that polycrystalline compositions of ceramics comprising oxides of elemental lanthanum, barium, and copper o exhibiting superconducting transition temperatures in the 30 K range;

P-2

R. J. Cava, R. B. van Dover, B. Batlog, and E. A. Reitman, "Bulk Superconductivity at 36 K in $La_{1.8}Sr_{0.2}CuO_4$", *Physical Review Letters*, Vol. 58, No. 4, pp. 408–410, which reports high-$T_c$ superconductivity in cuprate ceramics comprising oxides of elemental lanthanum, strontium, copper;

P-3

M. K. Wu, J. R. Ashburn, C. J. Torng, P. H. Hor, R. L. Meng, L. Gao, Z. J. Huang, Y. Q. Wang, and C. W. Chu, "Superconductivity at 93 K in a New mixed Phase Y—Ba—Cu—O Compound System at Ambient Pressure", Physical Review Letters, Vol. 58, No. 9, pp. 908–910, March 2, 1987, which reports high-$T_c$ superconductivity in cuprate ceramics comprising oxides of elemental yttrium, barium, and copper.

High-$T_c$ superconductivity is also observed in material systems that are classified as heavy-metal mixed alkaline earth copper oxides ("HM-$AE_1$-$AE_2$-Cu—O"):

P-4

H. Maeda, Y. Tanaka, M. Fukutomi, and Y. Asano, "A New High-$T_c$ Superconductor Without a Rare Earth Element", *Japanese Journal of Applied Physics*, Vol. 27, No. 2, pp. L209–L210, which reports high-$T_c$ superconductivity in cuprate ceramics comprising oxides of elemental bismuth, strontium, calcium, and copper.

P-5

Z. Z. Sheng and A. M. Hermann, *Nature*, Vol. 332, p. 55 (1988), which reports high-$T_c$ superconductivity in cuprate ceramics comprising elemental oxides of thallium, barium, strontium, and copper.

A variety of other ceramics that exhibit insulating ferroelectric, piezoelectric, electrically conductive, magneto-sensitive, insulating, and processes used to make them from precursor powders have been well known for many years:

P-6

W. D. Kingery, H. K. Bowen, and D. R. Uhlmann, "Introduction to Ceramics, 2nd Edition", John Wiley and Sons, New York, Copyright 1960 and 1976, discusses the existence of and methods to prepare insulating, electrically conducting, magneto-sensitive, and piezoelectric ceramic.

A common trait of ceramics with spinel, perovskite, or ilmenite crystal structures and their derivatives is that an essential property of the ceramic is anisotropic relative to its crystalline c-axis. That is, a preferred property that is essential to the proper functioning of a device may only be active or pronounced along a preferred crystallographic orientation of the ceramic. For instance, a high-$T_c$ superconducting ceramic will efficiently transport electrical current along the crystallographic a-b plane of the ceramic, and exhibit much poorer electrical conduction if the current is directed along the ceramic c-axis. Some magneto-sensitive ceramics will only change their properties if the applied magnetic field is directed along the c-axis of the ceramic.

It is thus important to exercise control over the alignment of the crystallographic c-axis throughout the bulk of the ceramic when fabricating a device of macroscopic dimension that has operational performance conditional on an orientation sensitive property of the complex ceramic. The case is clearly illustrated for high-$T_c$ superconducting ceramic in which the electrical current carrying capacity is greatly diminished when the ceramic is not properly oriented with the direction of electrical current flow throughout the bulk of the device. Critical current densities directed perpendicular to the ceramic a-axis are generally 2–3% of the electrical capacity available along orientations perpendicular to the ceramic c-axis:

P-7

S. R. Foltyn, P. Triwari, R. C. Dye, M. Q. Le, and X. D. Wu, "Pulsed laser deposition of thick $YBa_2Cu_3O_{7-\delta}$ films with $J_c>1$ $MA/cm^2$", Appl. Phys. Lett. 63(13), (1993), pp. 1848–1850, discusses optimizing electrical performance in a high-$T_c$ superconducting ceramic by depositing it as a c-axis textured thin film on a crystalline substrate with a similar crystal structure and a buffer layer on its deposition surface.

Performance is optimized in the ceramic when it is deposited as a c-axis textured thin film on a crystalline substrate. This configuration cannot be used in many relevant device applications that require geometrically shaped or mechanically flexible ceramic in large dimensions. Recent efforts have been made to adapt thin film processing technologies to make c-axis textured ceramic thick films on metal substrates. These composite structures have achieved high electrical current performance by first depositing a buffer layer on a flexible metal substrate that has the same or similar crystal structure as the high-$T_c$ superconducting ceramic:

P-8

X. D. Wu, S. R. Foltyn, P. Arendt, J. Townsend, C. Adams, I. H. Campbell, P. Tiwari, Y. Coulter, and D. E. Peterson, "High Current $YBa_2Cu_3O_{7-\delta}$ Thick Films on Flexible Nickel Substrates With Textured Buffer Layers", Applied Physics Letters 65(15) (1994) pp. 1961–1963, demonstrates high critical current superconducting ceramic can be obtained using ion beam assisted deposition on a c-axis textured yttria-stabilized zirconia buffer layer deposited using the same process on nickel substrate.

P-9

P. Arendt, S. Foltyn, X. Wu, J. Townsend, C. Adams, M. Hawley, P. Tiwari, M. Maley, J. Willis, D. Moseley, Y. Coulter, "Fabrication of Biaxially Oriented YBCO On (00l) Biaxially Oriented Yttria-Stabilized Zirconia On Polycrystalline Substrates", MRS Symposium Proceedings on Epitaxial Oxide Thin Films and Heterostructures, MRS Bulletin 341 (1994) discusses using ion-assisted, ion-beam sputter deposition to obtain (00l) biaxially oriented films of cubic yttria-stabilized zirconia on polycrystalline metal substrates on to which yttrium-barium-copper-oxide superconducting ceramic is then heteroepitaxially deposited via pulse laser deposition.

References P-7 to P-9 cited above demonstrate the ability to apply modem processing technologies to improve characteristic performance in ceramics that are orientation sensitive. All modem techniques apply the ceramic to a metal substrate by first depositing a textured ceramic buffer layer on the metal. The buffer layer must have the same or similar crystalline structure to the ceramic layer whose properties are essential to the proper functioning of the device. The presence of the electrically insulating buffer layer is harmful to the proper functioning of a device when it is necessary to achieve ohmic contact between the textured ceramic and the metal on to which it is deposited. In the case of superconductors cited above, this is of particular importance when making wire that is subsequently wound into solenoid magnets. It is now well known that it is necessary to have the superconductor in intimate contact with a high thermal and electrical conductivity metal to stabilize the performance of a superconducting magnet:

P-10

Martin N. Wilson, "Superconducting Magnets", Oxford University Press, New York (1983) discusses the importance of placing the superconductor in intimate contact with a metal to achieve optimal performance in a superconducting magnet.

Another limitation of applying film technology to the production textured ceramic devices is the limited thickness to which the ceramic can be made, 10 microns or less. Since electrical capacity scales with the cross-sectional area of the current conductor, the ultimate performance of these devices will be limited to a maximum current load. Furthermore, it is not possible to apply these structures to making multiple filamentary wires, since they consist of a metal substrate, an electrically insulating buffer layer, and a superconducting ceramic as a discrete continuous strip. More robust ceramic thickness is possible in composites using bulk processing techniques. These include billet-processing using the oxide-powder-in-tube or metal precursor methods:

P-11

K. H. Sandhage, G. N. Riley, Jr., and W. L. Carter, Journal of Metals (43) (1991) p. 21, discusses preparing bismuth cuprate superconducting wire by grinding, milling, and reacting oxide powders, packing the blend into a silver tube that is sealed at both ends, deforming the billet into wire, and reacting the packed powders into a superconducting phase of the ceramic.

P-12

A. Otto, C. Craven, D. Daly, G. R. Podtburg, J. Schrieber, and L. J. Masur, Journal of Metals 45 (1993) p. 48 discusses packing elemental metal precursors to the ceramic in a silver tube, extruding the billet into wire, and reactively oxidizing the elemental metal precursor into superconducting phases of the ceramic.

These two techniques allow ceramic to be made into filamentary components and to bulk continuous dimensions, but have several practical limitations. Since the ceramic precursor is packed within a sealed silver tube and reacted, these techniques do not allow c-axis textured ceramic to be produced with an exposed ceramic surface, if so desired. The steps of grinding and pulverizing the precursor powders prior to reacting them into ceramic is both time and energy intensive. Grinding and milling steps are also susceptible to material degradation due to abrasive contact with grinding machinery metal and the associated risk of erosion material contamination. Furthermore, these processes have not demonstrated an ability to consistently make uniform high quality textured ceramic.

Fully crystallized ceramic is not normally reactive with metal surfaces. Crystallized ceramic, including bulk c-axis textured ceramic, can be bonded to metal substrates to leave an exposed ceramic oxide surface:

P-13

V. A. Maroni, "Method of Bonding Metals to Ceramics", U.S. Pat. No. 5,010,053, issued Apr. 23, 1991.

Other relevant background to this invention is contained in:

P-14

J. S. Luo, N. Merchant, E. J. Escorcia-Aparicio, V. A. Maroni, B. S. Tani, W. L. Carter, and G. N. Riley, Jr., "Composition and microstructural evolution of nonsuperconducting phases in silver-clad $(Bi,Pb)_2Sr_2CaCu_2O_x$ composite conductors", Journal of Materials Research vol. 9, no. 12, (1994) pp. 3059–3067 discloses processing regimes that promote the growth of electrically insulating phases of bismuth cuprate ceramic.

Related Patents and Publications

The following prior art is deemed relevant to this invention. The disclosures relate generally to the use of metalorganic solutions that comprise metal precursors to a pertinent ceramic composition as salts of a carboxylic acid, and 2-ethylhexanoic acid in particular; or to the use of spray deposition techniques as a method to apply the ceramic precursor solution to a substrate. The first record publicly disclosing the use of a solution of 2-ethylhexanoate salts that comprise metal precursors to a RE-AE-Cu—O superconducting ceramic on yttria-stabilized zirconia was made by Nasu et al.:

P-15

H. Nasu, S. Makida, T. Kato, Y. Ibara, T. Imura, and Y. Osaka, "Superconducting Y—Ba—Cu—O Films with $T_c>70$ K Prepared by Thermal Decomposition Technique of Y—, Ba—, and Cu-2ethylhexanoates", Chemistry Letters, The Chemical Society of Japan, (1987), pp. 2403–2404, discloses the use of a carboxylic acid salt solution to prepare a superconducting ceramic on yttria-stabilized zirconia.

P-16

H. Nasu, S. Makida, T. Imura, and Y. Osaka, "$Ba_2YCu_3O_x$ films with $T_c(end)>80$ K prepared by the pyrolysis of 2-ethylhexanoates", Journal of Materials Science Letters 7 (1988) pp.858–866, discloses annealing treatments that improve the quality of superconducting ceramic thin films prepared on yttria-stabilized zirconia.

Both these references disclose the formation of a RE-AECu—O ceramic film on a substrate of similar crystalline structure. The precursors are applied to the substrate by first forming a liquid film coating, either by screen-printing or dip-coating techniques. The liquid film coating is then pyrolyzed into an amorphous oxide and then a crystalline oxide film using subsequent annealing steps.

Art remarkably similar to that disclosed by Nasu et al., and similar in some respects to this invention, has been recognized in patents issued by the United States Patent and Trademark Office:

P-17

J. M. Mir, J. A. Agostinelli, D. L. Peterson, G. R. Paz-Pujalt, B. J. Higberg, G. Rajeswarn, "Metalorganic deposition process for preparing superconducting oxide films", U.S. Pat. No. 4,880,770, issued Nov. 14, 1989.

P-18

J. A. Agostinelli, G. R. Paz-Puljalt, A. K. Mehrotra, L.-S. Hung, "Metalorganic deposition process for preparing heavy-pnictide superconducting oxide films", U.S. Pat. No. 4,950,643, issued Apr. 21, 1990.

Mir et al. (P-17) claim a method to prepare articles containing an electrically conductive rare-earth alkaline earth copper oxide (RE-AE-Cu—O) layer and processes for their preparation using a mixed metalorganic precursor. Agostinelli et al. (P-18) claim a method to prepare articles containing an electrically conductive heavy-pnictide mixed alkaline earth copper oxide (HP-AE-Cu—O) layer and processes for their preparation using a mixed metalorganic precursor. Heavy-pnictides are defined as the elements bismuth (Bi) and antimony (Sb), with the inclusion of small concentrations of lead (Pb).

Both these patents, as well as other related commonly assigned patents claim the same steps whereby which the patented articles are formed. In Step "A", a liquid coating of metalorganic precursors to the ceramics is applied to a substrate by passing the substrate through a reservoir of the solution comprised of metalorganic precursors to the ceramic dissolved in a film forming solvent. The application of a liquid coating is specifically defined as a distinct processing step that cannot be combined with subsequent processing steps. Subsequent processing steps are defined as (Step "B") comprising a heat treatment that pyrolyzes the liquid coating into an amorphous coating on the substrate; a further heat treatment (Step "C") that decomposes carbonate phases that result in the thermal decomposition of alkaline earth metal ligands and converts the amorphous oxide layer into a more electrically conducting crystalline form; a cooling treatment (Step "D") that reduces the applied heat from crystallization temperature(s) to 500° C. (preferably 200° C.) to form a rigid crystalline layer on the substrate; and a post-anneal (Step "E") in an oxygen-rich atmosphere to equilibrate the deposited crystalline layer. It is explicitly stated that only Steps "B" through "E" can be combined into a single processing step.

Agostinelli et al and Mir et al claim the use of spray deposition techniques to apply the precursors to the substrate, but only as a liquid coating. Agostinelli et al and Mir et al recognize the importance of c-axis texture in the crystallized layer, and acknowledge that crystallinity in the deposited layer can only be engendered if the ceramic coating is applied to a substrate of identical or similar crystalline structure. Agostinelli et al and Mir et al claim the use of substrates with similar or identical crystalline structures, and the use of such crystalline surfaces deposited as a barrier or buffer layer on substrates of dissimilar crystalline structure, including metal substrates. Agostinelli et al assert and claim that silver, used as the deposition surface, will promote c-axis orientation in the deposited ceramic layer even though it does not have a crystal structure that is compatible with the ceramic. Although Agostinelli et al claim the use of silver as a free-standing unitary substrate, and the use of an elongated silver substrate to produce superconductive articles of long length. This claim is not reduced practice. Agostinelli et al demonstrate HP-AE-Cu—O ceramic thin films on substrates of magnesium oxide (MgO), strontium titanate ($SrTiO_3$), silicon (Si), fused quartz, and sapphire; and on barrier layers of zirconia ($ZrO_2$) deposited on fused quartz, silicon, sapphire, and silicon dioxide ($SiO_2$) on silicon. Mir et al demonstrate the preparation of RE-AECu—O ceramic films on strontium titanate, copper, and glass fiber, but make no reference to controlling c-axis texture in the deposited layer.

Recent investigations into the art have shown that the appearance of c-axis texture in ceramic formed at a silver interface is due to a reaction-induced mechanism in the phase conversion of $(Bi,Pb)_2Sr_2CaCu_2O_8$ and $Bi_{1.80}Pb_{0.40}Sr_{1.91}Ca_{2.03}Cu_{3.06}O_{10-\delta}$ bismuth cuprate ceramic:

P-19
J. S. Luo, N. Merchant, V. A. Maroni, W. L. Carter, and G. N. Riley, Jr., Applied Physics Letters 61, (1992) p. 690 discloses the phenomenon of reaction-induced texture.

P-20
P. E. D. Morgan, J. D. Piche, and R. M. Housely, Physica C 191, (1992), p. 179, discloses evidence for a silver containing eutectic liquid that promotes the "solution reprecipitation" of $Bi_{1.80}Pb_{0.40}Sr_{1.91}Ca_{2.03}Cu_{3.06}O_{10-\delta}$ phase ceramic.

These studies show that silver actually participates in the reaction of bismuth cuprate (HP-AE-Cu—O) ceramic, acting as a catalyst that increases the rate of reaction. Bismuth cuprate ceramic will produce an accelerated growth front when reacted in contact with a silver interface. Growth will expand in directions where the ceramic is free to flow or experiences comparable reaction kinetics. As such, silver substrates by themselves do not assure c-axis texture unless silver is used as an interfacial layer between bismuth cuprate ceramic and a substrate of compatible crystalline structure. These facts are now well known.

References P-7 through P-9 clearly show that extraordinary measures must be taken to produce c-axis oriented films thicker than 0.5 micron even on single crystal surfaces. Evidence is now widely reported that ceramic layers deposited on silver substrates will not produce c-axis oriented films without mechanical texturing steps added to the process:

P-21
L. P. de Rochemont, V. A. Maroni, M. Klugerman, R. J. Andrews, and W. C. Kelliher, "Fabricating Multifilamentary Bismuth Cuprate Tapes by Metalorganic Spray Pyrolysis", Applied Superconductivity vol. 2, no. 3/4 (1994) pp. 281–294 discloses that bulk ceramic coatings formed by pyrolyzing 2-ethylhexanoate precursor salts do not have c-axis orientation, and that c-axis texture is only induced by multiple mechanical swaging steps incorporated into the reaction process between thermal processing steps.

Neither Agostinelli et al nor Mir et al demonstrate that c-axis oriented ceramic can be formed on a unitary silver substrate, nor do they claim the use of thermomechanical processing steps to endow a ceramic deposited on silver with c-axis texture. Given recent developments to the art it cannot be claimed that c-axis orientation is an obvious extension of pyrolyzing ceramic from liquid coated metalorganic precursors on the surface of a silver substrate.

Agostinelli et al and Mir et al only claim methods to produce articles coated with ceramic layers that are 1.5 and 1.0 micron thick or less, respectively. If it is desirous to achieve ceramic layers with thickness greater than 1.0 and 1.5 micron it is necessary to repeat the processing steps "A" through "E", as defined by Agostinelli et al and Mir et al.

DeSisto et al (P-22) disclose the pyrolysis of metalorganic precursors to a RE-AE-Cu—O ceramic on a dielectric magnesium oxide (MgO) substrate heated to 430° C. and subsequent annealing.

P-22
W. J. DeSisto, R. L. Henry, M. Osofsky, and J. V. Marzik, "$YBa_2Cu_3O_{7-\delta}$ thin films deposited by an ultrasonic nebulization and pyrolysis method", Thin Solid Films, 206 (1991) pp.128–131, discloses the formation of a RE-AE-Cu—O thin film by pyrolyzing metalorganic precursors in an alcohol by spraying the solution onto a heated dielectric substrate. MgO has identical or similar crystal structure to the deposited ceramic. Thin films with c-axis orientation are reported, but only in films with thickness of 0.5 micron or less, which is consistent with the finding that these ceramic thin films flip their orientations at a thickness of ~0.5 micron from c-axis oriented to a-axis oriented even on compatible single crystal substrates (P-7). DeSisto et al do not demonstrate that a c-axis oriented ceramic coating can be formed on a metal substrate with non-compatible crystal structure, nor is the use of mechanical texturing steps between thermal processing treatments disclosed. DeSisto et al use solutions comprising volatile metal precursor derivatives of 2,2,6,6,-tetramethyl-3,5-heptanedione and 1-butanol as a solvent, rather than a solution of carboxylic acid salts.

Neither DeSisto et al, nor Agostinelli et al, nor Mir et al disclose methods to prepare carboxylic acid salt precursor solutions that reduce the formation of alkaline earth carbonate phases in subsequently spray pyrolyzed deposits. Neither DeSisto et al, nor Agostinelli et al, nor Mir et al disclose and demonstrate methods to prepare bulk c-axis oriented ceramic layers with thickness in excess of 2.5 micron on metal substrates with or without a buffer, barrier, or surface layer that has compatible crystal structure to the ceramic.

SUMMARY OF THE INVENTION

Broadly the present invention provides a method for adding a c-axis oriented metal oxides ceramic layer onto a metal substrate to form a composite. This is accomplished by a) dissolving metal organic precursors in a solvent therefor b) heating the metal substrate to a temperature sufficient to decompose the above precursors and to boil such solvent.

The above precursors and solvents are then spray pyrolized onto the surface of the heated metal substrate to form a porous amorphous metal oxide ceramic layer thereon to form such composite.

Preferably the above porous ceramic layer is then mechanically compressed to densify and partially crystalize same.

In an additional preferred state the above ceramic layer is thermomechanically calcined to further crystalize the ceramic layer.

The invention further provides a ceramic-metal composite having a) metal substrate and b) a c-axis oriented ceramic layer bonded directly to the substrate and having a thickness of 0.6 to 2.5 to 100 microns or more.

Preferably the ceramic layer is densified in the above composite.

In one aspect this invention is directed to an article comprised of a pure metal or metal alloy substrate and a bulk ceramic oxide layer located on the substrate characterized in that the ceramic is dense and has sufficient thickness not to be considered a film, has a crystalline structure that is of the spinel-type, perovskite-type, ilmenite-type, or a crystalline structure that is a derivative of such types, and has its crystalline c-axis uniformly oriented throughout the ceramic layer.

In another aspect this invention is directed to an article comprised of a substrate and a layer of an amorphous metal oxide located on the substrate characterized in that the amorphous metal oxide is a precursor to a complex ceramic oxide composition that displays properties characterizing those of either an insulating ferroelectric ceramic, an electrically conductive ceramic, a piezoelectric ceramic, a magneto-sensitive ceramic, an insulating ceramic, or a superconducting ceramic when fully crystallized.

In a principal aspect this invention is directed to a process comprising the application of metalorganic precursors to such ceramics on a pure metal or metal alloy substrate by thermally decomposing such metalorganic precursors on the surface of the pure metal or metal alloy substrate as an amorphous oxide deposit without first forming a liquid coating of the ceramic precursors on the metal substrate, whereby the liquid coating is subsequently pyrolyzed to form an amorphous oxide in an additional, and distinctly separated, processing step. The process is characterized in that a solution consisting of a volatile organic solvent and metal ligand compounds of each metal oxide used to form the ceramic is spray deposited in the presence of oxygen on to the pure metal or metal alloy substrate, which is preheated to a temperature that is at least in excess of the decomposition temperature of the ligand that is most sensitive to thermal decomposition and is part of the metal ligand compound that is least sensitive to thermal decomposition, and that this temperature is well in excess of the boiling point of the volatile organic solvent used to dissolve the metal ligand compounds.

In another principal aspect the process is characterized by additional processing steps that thermomechanically calcine the deposited amorphous oxide layer into a mixture of partially crystallized and amorphous phases of the ceramic by a series of short reaction treatments and mechanical working steps that serve to density and initiate preferential orientation to the c-axis of crystalline nuclei in the ceramic layer when it is fully crystallized at a very early stage of crystallization.

In another particular aspect of the invention, the repetitive action of multiple short reaction treatments and mechanical densification treatments is used to fully crystallize the mixed partially crystallized phase and amorphous oxide layer into a bulk c-axis oriented ceramic directly on the pure metal or metal alloy substrate without the use of a barrier or buffer layer inserted between ceramic and metal layers of dissimilar crystalline structure.

In a further aspect this invention is directed at forming a composite structure that comprises a pure metal or metal alloy layer adhered to an amorphous ceramic oxide layer or a layer that comprises a mixture of partially crystallized and amorphous ceramic oxide phases that is also adhered to another pure metal or metal alloy layer that may or may not be the same pure metal or metal alloy composition as is adhered to the opposing surface of the ceramic layer.

In a further aspect this invention is directed at forming a composite structure that comprises a pure metal or metal alloy layer adhered to a c-axis oriented ceramic layer that is also adhered to another pure metal or metal alloy layer that may or may not be the same pure metal or metal alloy composition as is adhered to the opposing surface of the ceramic layer.

In another further aspect this invention is directed at forming a composite structure that comprises multiple filamentary strands of metal-ceramic composite, wherein each filament comprises a pure metal or metal alloy layer adhered to an amorphous ceramic oxide layer or a layer that comprises a mixture of partially crystallized amorphous ceramic oxide phases that is also adhered to another pure metal or metal alloy layer that may or may not be the same pure metal or metal alloy composition as is adhered to the opposing surface of the ceramic layer. In another further aspect this invention is directed at forming a composite structure that comprises multiple filamentary strands of metal-ceramic composite, wherein each filament comprises a pure metal or metal alloy layer adhered to a c-axis oriented ceramic layer that is also adhered to another pure metal or metal alloy layer that may or may not be the same pure metal or metal alloy composition as is adhered to the opposing surface of the ceramic layer.

In another specific aspect this invention is directed at forming a composite structure that comprises multiple filamentary strands of metal-ceramic composite, wherein each filament comprises a pure metal or metal alloy layer adhered to an amorphous ceramic oxide layer or a layer that comprises a mixture of partially crystallized amorphous ceramic oxide phases that is also adhered to another pure metal or metal alloy layer that may or may not be the same pure metal or metal alloy composition as is adhered to the opposing surface of the ceramic layer, that is mechanically deformed, extruded or mechanically worked into other shapes and forms including wire, sheet, or curved topological surfaces.

In another specific aspect this invention is directed at forming a composite structure that comprises multiple filamentary strands of metal-ceramic composite, wherein each filament comprises a pure metal or metal alloy layer adhered to a c-axis oriented ceramic layer that is also adhered to another pure metal or metal alloy layer that may or may not be the same pure metal or metal alloy composition as is adhered to the opposing surface of the ceramic layer, that is mechanically deformed, extruded or mechanically worked into other shapes and forms including wire, sheet, or curved topological surfaces.

In another further aspect this invention is directed at a process that allows a metalorganic precursor solution comprising two distinct species of alkaline earth metal precursors to be formed, wherein the process used to prepare the solution sharply reduces the formation of alkaline earth carbonate phase material when the solution is pyrolyzed into a solid precursor.

In a more specific aspect this invention is directed at synthesizing metal-ceramic composite structures wherein the ceramic layer(s) exhibit insulating ferroelectric or piezoelectric properties and have chemical compositions classified as alkaline earth titanates, lead lanthanum titanate, lead zirconate-titanate, lead lanthanum zirconate-titanate, alkaline earth zirconates, alkaline earth stannates, lead lanthanum stannate, zirconate-stannates, or stannate-titanates.

In another more specific aspect this invention is directed at synthesizing metal-ceramic composite structures wherein the ceramic layer(s) exhibit insulating properties and have chemical compositions classified as alkaline earth aluminates.

In another more specific aspect this invention is directed at synthesizing metal-ceramic composite structures wherein the ceramic layer(s) exhibit electrically conducting properties and have chemical compositions classified as indium-tin oxides, or complex copper oxides, of which high-$T_c$ superconductors are a subset.

In another more specific aspect this invention is directed at synthesizing metal-ceramic composite structures wherein the ceramic layer(s) exhibit magneto-sensitive properties and have chemical compositions classified as rare-earth magnesium oxides or ferrites.

In another more specific aspect this invention is directed at synthesizing metal-ceramic composite structures wherein the ceramic layer(s) exhibit superconducting properties when cooled below a critical transition-temperature and have chemical compositions classified as bismuth cuprates.

In another more specific aspect this invention is directed at a process to construct metal-ceramic composite structures wherein at least one filamentary component of high transition-temperature superconducting ceramic has the orientation of its ceramic c-axis positioned relative to a transverse axis of the composite or the oriented c-axis of other ceramic filaments in the composite structure.

In another more specific aspect this invention is directed at a process to construct metal-ceramic wherein at least one c-axis oriented filamentary component of high-transition temperature superconducting ceramic has been placed adjacent to at least one c-axis oriented ceramic filament that has either piezoelectric, insulating, electrically conducting, or magneto-sensitive properties. In another more specific aspect this invention is directed at a device comprising a metal-ceramic composite structure wherein the electromagnetic performance of at least one filamentary component of high transition-temperature superconducting ceramic is stabilized by the orientation of its ceramic c-axis positioned relative to a magnetic field applied relative to a transverse axis of the composite or the oriented c-axis of other ceramic filaments in the composite structure. This invention is particularly useful to the manufacture of composite structures containing high-$T_c$ superconducting ceramic filamentary components, which are known to have poorer resistance to magnetic flux jumping if applied or generated magnetic fields are oriented parallel to their crystallographic c-axis, particularly at temperatures above 10–15 K. This capability can allow the construction of high-$T_c$ superconducting metal composite architectures designed to function at higher operating temperatures than what is currently capable in composite structures constructed using more conventional synthesis methods. It further allows specific architectural designs to be implemented for specific superconducting applications.

In another more specific aspect this invention is directed at a device comprising a metal-ceramic composite structure wherein the electromagnetic performance of at least one filamentary component of high transition-temperature superconducting ceramic is stabilized by having been placed adjacent to at least one c-axis oriented ceramic filament that has either piezoelectric, insulating, electrically conducting, or magneto-sensitive properties.

In another more specific aspect this invention is directed at a process to add to the composite other metallic or metal alloy filamentary components in intimate contact with the superconducting filaments to improve the thermal or mechanical characteristics of the composite structure.

The present invention makes available to the art for the first time articles containing a dense, c-axis oriented ceramic layer directly attached to a substrate that is pure metal or metal alloy without the need for an interfacial barrier, buffer, or surface layer that has a crystal structure compatible with the ceramic. Additionally, the present invention makes available to the art for the first time such articles where there is no limitation to the thickness of the c-axis oriented ceramic layer. This invention makes possible many devices based on an active orientation-sensitive property of a complex ceramic that requires intimate contact between the ceramic and a metallic electrode that could not be made using an interfacial barrier, buffer, or surface layer inserted at the boundary between the ceramic and metallic layers. Further, this invention makes possible many devices of macroscopic scale that incorporate such metal-ceramic composites in bulk dimensions that cannot be made using ceramic thin films, such as solenoid magnets, high capacity electrical cables, or bulk sheet structures. Further still, this invention makes possible many devices of macroscopic scale with functional properties that can be made more efficient when different types of c-axis oriented ceramic are incorporated as filaments into the device structure.

Figure 1:
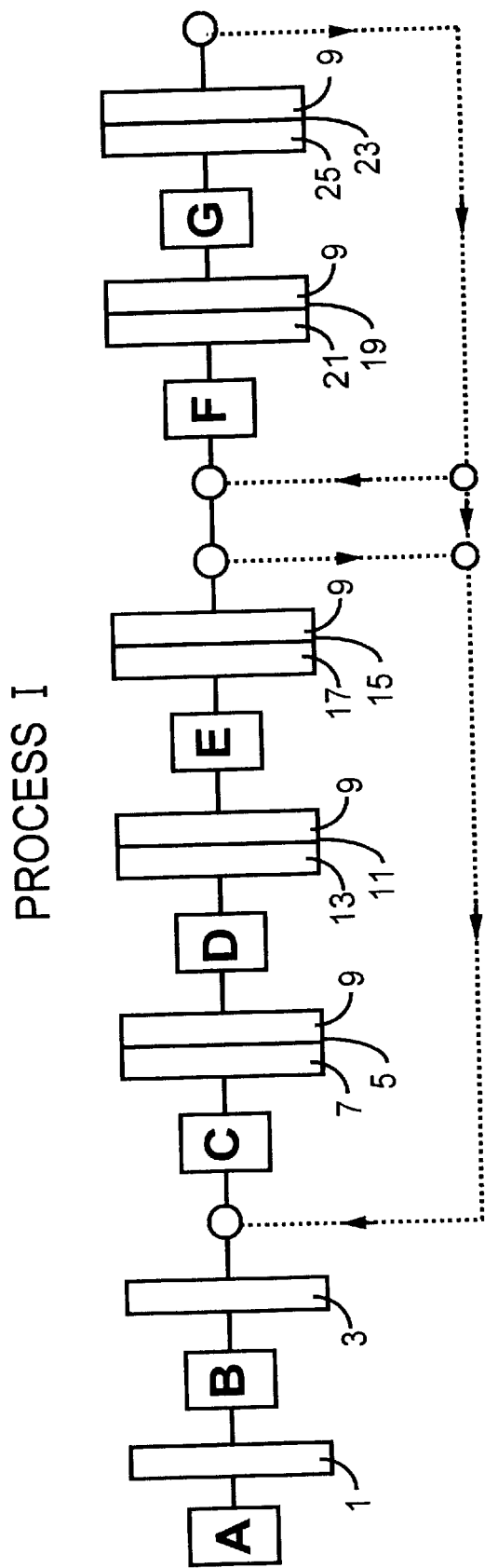
FIG. 1. Process schematic detailing construction of a ceramic coated substrate under the invention.

DESCRIPTION OF PREFERRED
EMBODIMENTS OF THE INVENTION

The present invention has as its purpose to make available articles of macroscopic dimension that contain at least one pure metal or metal alloy sheet or layer directly adhered to at least one ceramic layer, without the use of an external bonding agent (P-13), or an interfacial buffer, barrier or surface layer (P-7–P-9, and P-18), wherein the ceramic layer exists either as an amorphous oxide, a partially crystallized oxide, or a fully crystallized c-axis oriented ceramic, to improve the quality of a characteristic property of the composite structure that fundamentally increases a measure of operational or device performance for which the article is used.

This invention relates generally to ceramics with spinel, perovskite, ilmenite crystal structures and their derivatives that are known to have insulating, ferroelectric, piezoelectric, electrically conducting, and magneto-sensitive properties. This invention relates specifically to perovskite bismuth cuprate and lead-modified bismuth cuprate ceramics that are known to have high transition-temperature superconducting properties. Perovskite bismuth cuprate superconducting ceramics have been alternatively referred to in the prior art as heavy pnictide mixed alkaline earth copper oxides, where the term "heavy pnictide mixed alkaline earth copper oxide" refers to a composition of matter containing at least one heavy pnictide element, at least two alkaline earth elements, copper and oxygen. The term "heavy pnictide" refers to elements having an atomic number of at least 51 that are contained in Group 15 of the periodic table, i.e., antimony (Sb) and bismuth (Bi). The term "alkaline earth metal" refers to elements found in Group 2 of the periodic table, i.e., magnesium, calcium, strontium, and barium. Lead-modified bismuth cuprate ceramic is understood to mean a heavy-pnictide mixed alkaline earth copper oxide into which lead oxide has been incorporated in a proportion of 5 mol % or less.

In compliance with the established practice of the ceramics community, acronyms will be used to refer to specific ceramic compositions. Bi—Sr—Ca—Cu—O is alternatively used to describe bismuth cuprate and lead-modified bismuth cuprate ceramics. BST is alternatively used to describe barium-strontium titanate ceramic. PZT is alternatively used to describe lead zirconate-titanate ceramic. PLZT is alternatively used to describe lead lanthanum zirconate-titanate ceramic.

Except as otherwise noted all steps in the preparation of the metal-ceramic composite articles that are the subject of this invention are understood to be practicable at atmospheric pressures, although the gas atmospheres in which the ceramic composite is processed usually must be controlled and the partial pressure of oxygen gas in said atmosphere is understood to be an important processing parameter. It is, of course, recognized that bismuth cuprate ceramics are highly sensitive to the partial pressure of oxygen to which the ceramic is exposed when heated to temperatures greater than 550° C.

The present invention can be appreciated if it is broken into three distinct process applications. Process application I ("process I") produces articles that comprise a substrate coated with a bulk amorphous ceramic layer, having thickness greater than 2.5 microns, that are thermomechanically processed to construct a dense amorphous oxide, partially crystallized or fully crystallized ceramic layer. Complete c-axis orientation is achieved in the fully crystallized layer. The thickness of the ceramic layer may have reduced dimension after the thermomechanical processing step. Process application II ("process II") builds upon steps defined in process I to produce articles that comprise a substrate coated with a bulk amorphous or crystallized ceramic layer adhered to the bulk ceramic layer of a second coated substrate to form a composite substrate-ceramic-substrate filamentary structure. Both processes I & II entail thermomechanical processing steps to transform the amorphous ceramic layer of the composite into a dense, partially crystallized or fully crystallized ceramic with uniform c-axis orientation. If the article so produced is processed to a state of intermediate crystallization, its density and c-axis texture may be sufficient to achieve uniform c-axis texture in later processing without further thermomechanical treatment. Process application III ("process III") comprises methods to work the intermediately or fully processed composite filaments into a closed metal matrix to form a shaped multifilamentary composite structure of fully crystallized, c-axis textured ceramic filaments.

Process I (see FIG. 1) is used to prepare in step "A" an article 1 comprising metalorganic precursor salt complexes of an alkaline earth metal, or mixed alkaline earth metals, when appropriate, that have at least one ligand of a carboxylic acid group that is sensitive to thermal decomposition. It is known to those skilled in the art that metalorganic precursors of alkali and alkaline earth metals will thermally decompose into alkali and alkaline earth carbonates. These carbonate phases can be subsequently converted into their irreducible oxide forms by thermal decomposition in an oxidizing environment of suitable temperature. Calcium carbonate ($CaCO_3$) will deflagrate in oxidizing atmospheres when heated to temperatures above 550° C. Strontium carbonate ($SrCO_3$) deflagrates in oxidizing atmospheres when heated to temperatures above 820° C., and barium carbonate ($BaCO_3$) needs to be heated to temperatures in excess of 900° C. in an oxidizing atmosphere to be converted to its irreducible oxide. The stability of the carbonate phases and the temperatures to which they must be heated to be converted into their oxide phases can seriously damage a key performance characteristic of a complex ceramic prepared using metalorganic precursors. This is best exemplified by considering the Bi—Sr—Ca—Cu—O or PZT ceramics. It is well known to those skilled in the art that alkali and alkaline earth oxides doped into PZT ceramic will stabilize polarization dependent properties of the ceramic. Bi—Sr—Ca—Cu—O contains strontium and calcium oxides as primary compositional components. Precursor to the these ceramics that contain or produce $CaCO_3$, $SrCO_3$, or $BaCO_3$ phases, which must be subsequently converted into their oxide forms, can in fact expose the ceramic to processing conditions that irreversibly damage a key performance characteristic desired by the ceramic. PZT ceramic crystallizes at temperatures between 550 and 700° C. It is necessary to have an alkali or alkaline earth additive participate in the crystallization process as an oxide. Heating an amorphous PZT ceramic to elevated temperatures that decompose some carbonate phases risks vaporizing a volatile component or damaging ceramic performance by the incongruent melting of a partial crystalline phase. Heating bismuth cuprate ceramic in conditions that decompose $SrCO_3$ risks the irreversible nucleation and growth of insulating oxide phases that impede current conduction between electrically conductive grains of the ceramic (P-14).

Figure 2:
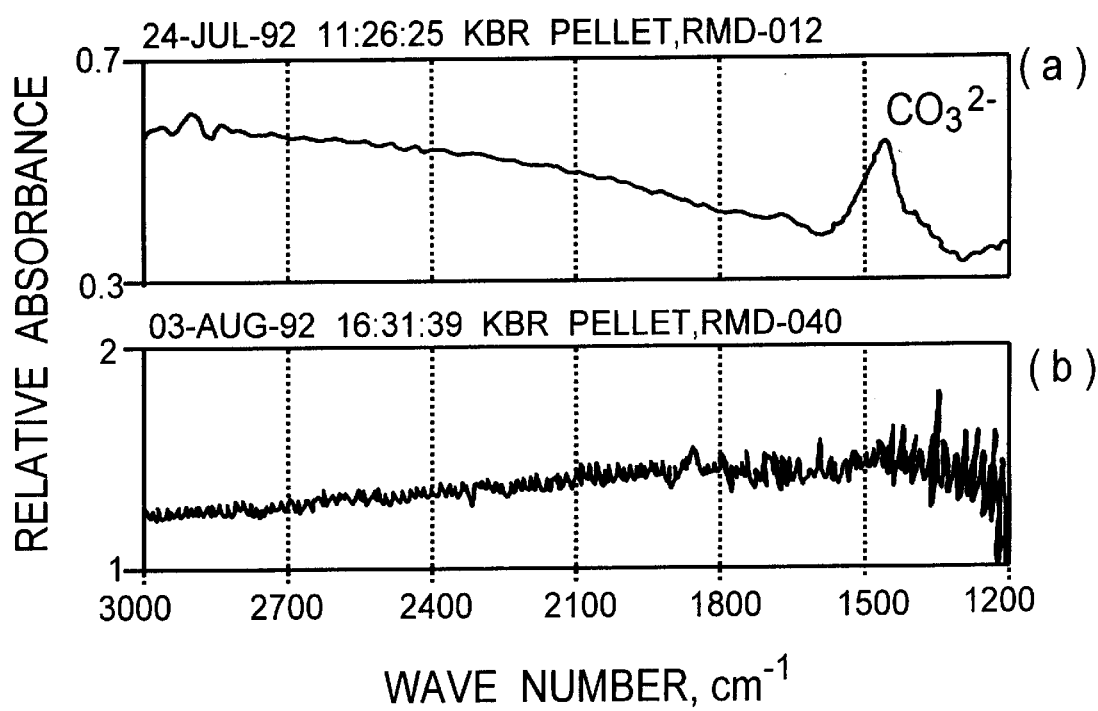
FIGS. 2(a) and (b). Infrared spectra showing (a) the presence of carbonate phase material in the decomposition product(s) of a bismuth cuprate precursor solution heated above 800° C., and (b) the absence of carbonate phases in the decomposition products of a bismuth cuprate precursor solution heated only to 500° C., but had been prepared by simultaneously co-reacting the alkaline metal precursors with the carboxylic acid solvent.

In those cases where it is necessary to prepare a ceramic with mixed alkaline earth metals, and it is desirable for the carboxylic acid salts of alkaline earth metals to decompose without producing significant amounts of alkaline earth carbonate phase material, (see FIG. 2), said mixed alkaline earth metals are simultaneously co-reacted as elemental metals with the carboxylic acid ligand to form said carboxylic acid salt complex. This method of solution preparation is described according to:

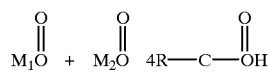

where the ligand to the alkaline earth metals ($M_1$ and $M_2$) is an alkyl or aryl group R attached to a carboxylic acid group. The mechanism that causes carboxylic acid salts of alkaline earth metals that have been simultaneously co-reacted as elemental metals with the carboxylic acid to thermally decompose without producing alkaline earth carbonate phases in significant amounts is not understood at this time. It is believed that a dimerized salt complex containing both alkaline earth metals may be responsible for this phenomenon. Step "A" is not a necessary process step when no alkaline earth metals are needed to form the desired ceramic.

A further step "B" is applied wherein article 1 is mixed with a mixture of carboxylic acid salts of heavy-pnictides and copper, which have at least one ligand that is sensitive to thermal decomposition, and a volatile solvent to form article 3 comprising a compositional distribution of carboxylic acid salt complexes of heavy-pnictide mixed alkaline earths and copper. The compositional distribution of metal cations in article 3 is appropriate to form electrically conducting ceramic phases of heavy-pnictide mixed alkaline earth copper oxide ceramic after subsequent processing. Step "B" is similarly used to prepare articles 3 that comprise precursor solutions with metal cation distributions that form ferroelectric, piezoelectric, magneto-sensitive, electrically conducting or insulating ceramic when pyrolyzed and subsequently processed.

A further step "C" wherein article 3 is used to directly form an article 5 that comprises an amorphous ceramic coating 7, with thickness greater than 2.5 microns, onto a substrate 9. Said coating 7 is formed without first forming a liquid coating on the substrate 9 by spray depositing the solution 3 onto 9 in an oxygen atmosphere chamber heated to temperatures in excess of the boiling point of the volatile solvent comprised by 3. To avoid the formation of any liquid species on the surface of substrate 9, it too is heated to a temperature greater than the boiling point of the volatile solvent that is at least in excess of the decomposition temperature of the ligand that is most sensitive to thermal decomposition and is part of the metal ligand complex that is least sensitive to thermal decomposition. This substrate temperature assures the complete volatilization of the organic solvent from the precursor deposit, as well as the complete or partial pyrolysis of all the metalorganic precursors. This action allows article 5 to be prepared without ever depositing a liquid precursor coating. It is noted that the term "amorphous" as used herein does not exclude the occurrence of some crystalline phases in the ceramic deposit.

Mixing the metalorganic precursors in solution allows the process to achieve metal ligand subdivision at the molecular level in a matter of minutes. The use of solutions prepared from carboxylic acid salts dissolved into an organic solvent is also a requisite and preferred embodiment of this invention. These acids are easily converted into non-volatile salts that can be held together in a crystalline solid by strong electrostatic forces. The temperatures that are required for melting the lattice of a carboxylic acid salt deposit are so high, usually 300–400° C., that carbon-carbon bonds break and the molecules decompose before the melting point is reached. This combination of low volatility and low-temperature pyrolysis within a relatively predictable range of decomposition temperatures makes these metalorganic precursors ideal for the spray deposition of ceramic deposits.

The use of an aerosol spray decomposition technique is a requisite and preferred embodiment of this invention because it preserves the ultrafine precursor subdivision better than any other solution application technique. Each of the dissolved metal ligands pyrolyze into an irreducible oxide at a different decomposition temperature. When a dissolved salt decomposes into its oxide form it precipitates from the solution. Differences in the decomposition temperatures of the different metalorganic precursor compounds can cause their respective metal oxides to be phase separated in the pyrolyzed deposit. This occurs even when the same ligand is attached to the different metals and the liquid precursor is heated at a rate that is not fast enough to avoid the sequential decomposition of the different metalorganic compounds. Sequential decomposition is best exemplified by considering a solution comprised of two metalorganic precursors, where the ligand compound to one of the metals decomposes at a temperature of 265° C., while the other decomposes at 450° C. A liquid coated precursor film is fully pyrolyzed when it is heated to the highest temperature needed to thermally decompose all of the precursors. As the solution is heated from room temperature, at which a liquid coating is usually formed, to a temperature above 450° C., the salt that decomposes at 265° C. will decompose, precipitate from solution, and separate at the molecular level from the salt that decomposes at 450° C. When the solution reaches a temperature above 450° C., the second metal ligand compound will decompose, leave a solution precipitate that is largely composed of two different microstructures.

Figure 3:
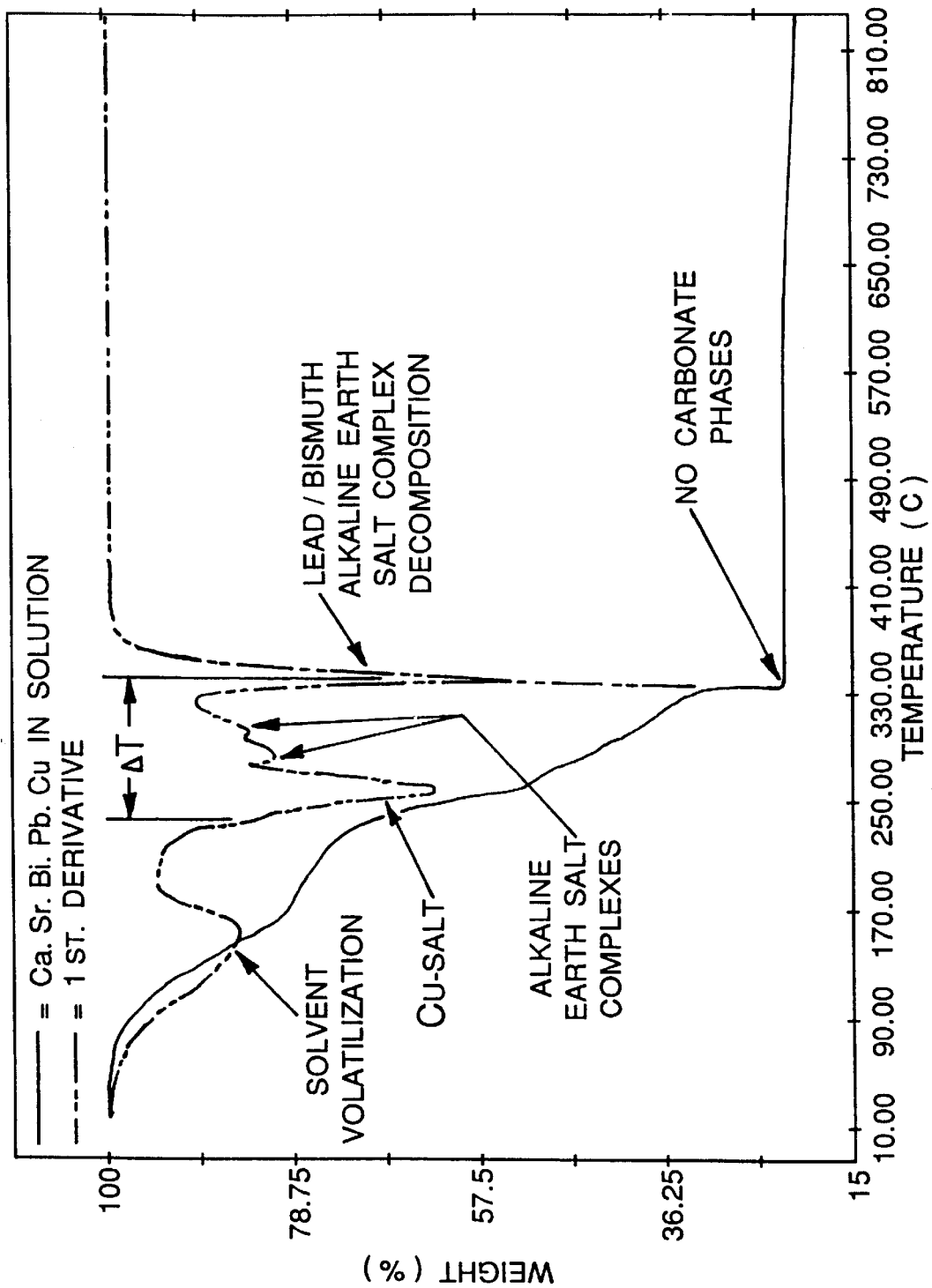
FIG. 3. Thermogravimetric analysis is used to show thermal decomposition spectra of carboxylic acid precursor salts in a solution used to manufacture bismuth cuprate high-$T_c$ superconducting ceramic.

Sequential decomposition is reduced by heating the solution at a rate that is sufficiently rapid to achieve the nearly simultaneous decomposition of all the metalorganic precursors. It is also beneficial to use metalorganic precursors that pyrolyze at nearly the same decomposition temperature. The synthesis of a precursor salt solution from a carboxylic acid-based chemistry allows all of the precursors to decompose over a fairly narrow temperature range. FIG. 3 uses a thermogravimetric trace to characterize the narrow range of decomposition temperatures ($\Delta T=100°$ C.) over which the five different 2-ethylhexanoate salts used to synthesize B—Sr—Ca—Cu—O ceramic will pyrolyze.

The use of an aerosol spray decomposition technique is a requisite and preferred embodiment of this invention because it achieves far greater rates of heating than can be achieved by applying the solution to the substrate by spin-coating, dip-coating, or even spray coating a liquid film, and thus maintains the ultrafine subdivision achieved in the solution. In aerosol spray decomposition the metalorganic precursors are confined to the volume of a droplet that is "cooled" by the adiabatic expansion of the liquid. The organic solvent molecules, which are not attached as ligands to the metal ions, will rapidly volatilize from droplet in the heated chamber Since the liquid medium has been evaporated from the droplet the ultrafine subdivision of the carboxylic acid salts is "frozen" within the waxy residue of a droplet by the strong electrostatic forces normal to a lattice of carboxylic acid salts. The salts then pyrolyze with this ultrafine subdivision when the spray-dried drop contacts the surface of the hot metal substrate. Hence, even if sequential decomposition does occur, precursor phase separation is constricted by the size of the droplet and its solid state forces, allowing precursors to be subdivided to at least within a physical proximity defined by some fraction of an average droplet size. This rate of heating cannot be achieved by heating a liquid film coating. Pyrolyzing a liquid film by running it through a hot furnace does not achieve a rate of heating sufficient to prevent sequential decomposition and separation of the precursors' oxide phases because metalorganic molecules are free to assemble across the substrate in the fluid medium of the boiling solvent.

Ultrafine subdivision in the deposit adds greater control to the process during subsequent processing, which is not achieved in powder preparations or in phase separated films. Phase conversion reactions occur at the interfaces between particles of distinct microstructure. For instance in Bi—Sr—Ca—Cu—O, a nucleation site that forms at the interface between three particles of the five metal oxide components, for instance CaO, SrO, and CuO, is likely to produce crystalline phases that are different from a nucleation site that interfaces $Bi_2O_3$, PbO, and CaO microstructures. Intermediate ceramic phases must first be uniformly nucleated in order to blend all of the components into a single crystalline phase. Ultrafine subdivision in the deposit allows the lower complexity phases to have similar chemical properties and, thus, form the desired single phase with a high degree of regularity in subsequent processing.

The application of the metalorganic precursors using an aerosol spray also allows composite structures of indefinite continuous length or surface area to be formed. Since the spray application technique can be performed in an open chamber, there is no physical limitation to the surface dimension of metallic substrate that can be fed into the system input. Manufacture of composite articles of extremely long continuous lengths can be achieved by winding the metallic substrate on to a pay-out spool and it into the system off the spool. Once the ceramic layer has been deposited, the composite structure can be collected onto a pick-up spool and stored for further processing.

A further step "D" is used wherein article 5 is heated in an oxygen atmosphere to a temperature of at least 550° C. to decompose any organic ligands that did not decompose during step "C" to produce an article 11 comprising a porous amorphous oxide coating 13 on a metallic substrate 9.

An optional step "E" comprising a compression step is used to mechanically work article 11 by means of a mechanical swage, cold roll, or hot press, to produce article 15 that comprises a densified or compressed amorphous oxide coating 17 on a substrate 9, with the option to repeat process steps "C" through "E" to produce articles 15 with progressively thicker densified amorphous oxide coatings 17 on a substrate 9. Articles produced using steps "A" through "E" are useful device elements in the thin film process known to practitioners of the art as physical vapor deposition. In physical vapor deposition such a device, commonly referred to as a sputtering target, is used as the cathode of an ion gun to emit electrons into a cloud of inert gas atoms. The emitted electrons ionize the inert gas atoms, which in turn bombard the surface of the sputtering target. The ion bombardment is sufficiently energetic to cause atoms on the target surface to diffuse off the target and deposit as a high quality thin film on a near-by substrate. Process control is improved when the target is uniform at the molecular level and makes uniform electrical contact with the metal backplate delivering electrical voltage to the cathode. This is difficult to achieve in conventionally processed complex ceramic materials. Ceramics pressed from powders do not have molecular uniformity. Complex ceramics sintered from powders often do not have compositional uniformity. Both types of conventionally processed ceramic are sputtering targets are electrically bonded to the metal backplate by means of an external bonding agent, which does not assure uniform electrical contact. Sputtering target devices produced using steps "A" through "E" of the invention comprise a compositionally uniform ceramic layer with ultrafine subdivision bonded directly to an electrically conductive metal. As such, uniform electrical contact between the metal backplate and the ceramic cannot be compromised in the sputtering target by voids that often occur in the layer between a ceramic and the metal backplate when an external bonding agent is used as an adhesive to form a conventional ceramic sputtering target.

An optional step "F" is used in which the amorphous oxide coating 17 of article 15 is thermally reacted, or reacted by exposure to electromagnetic radiation at frequencies in the microwave or optical spectrum, in a controlled gas atmosphere to form an article 19 that comprises a fully or partially crystallized randomly oriented ceramic layer 21 on a substrate 9. Any such processing treatment that advances the state of crystallinity in the ceramic layer is herein referred to as a "reaction step". Reaction steps involve the delivery of heat to the ceramic of an amount sufficient to activate solid-state diffusion mechanisms and crystalline ordering in the ceramic, which may comprise thermal heat treatments wherein the ceramic is exposed to an elevated temperature, or radiation treatments wherein heat is delivered to the ceramic through the absorption of electromagnetic radiation. Heat must be delivered to the ceramic in an amount equivalent to the amount of heat contained within the ceramic at a crystallization temperature. Crystallization temperatures for B—Sr—Ca—Cu—O ceramic depends upon the oxidation potential of the ambient atmosphere, but will range from 775° C. to 845° C. Crystallization temperatures for PZT ceramic ranges from 500° C. to 750° C. Crystallization temperatures for common piezoelectric, magneto-sensitive, insulating ferroelectric, insulating spinel, and electrically conductive ceramics are reported in P-6.

An optional compression step "G" is used in which the fully crystallized or partially crystallized layer 21 of article 19 is physically worked by means of a mechanical swage, cold roll, or hot press, to produce an article 23 comprising a densified crystallized coating 25 on a substrate 9, with the option to repeat steps "F" and "G", or steps "C" through "G" to produce articles 23 with progressively thicker, densified, c-axis oriented crystallized coatings 25 on a substrate 9. In addition to ceramic sputtering targets, process steps "A" through "G" allow the invention to usefully applied as a heat shielding device. It is contemplated that such a heat shielding device comprises a thermally insulating ceramic layer on a high thermal conductivity metal. The device is inserted between a hot body and a heat shielded body, with the ceramic layer exposed to shielded body and the metal layer exposed to the hot body. The metal layer also being attached to a thermal reservoir. Heat emissions from the hot body are captured by the shield. Its metal layer laterally transports the heat to the thermal reservoir, while the ceramic layer prevents heat from flowing towards the shielded body.

Figure 4:
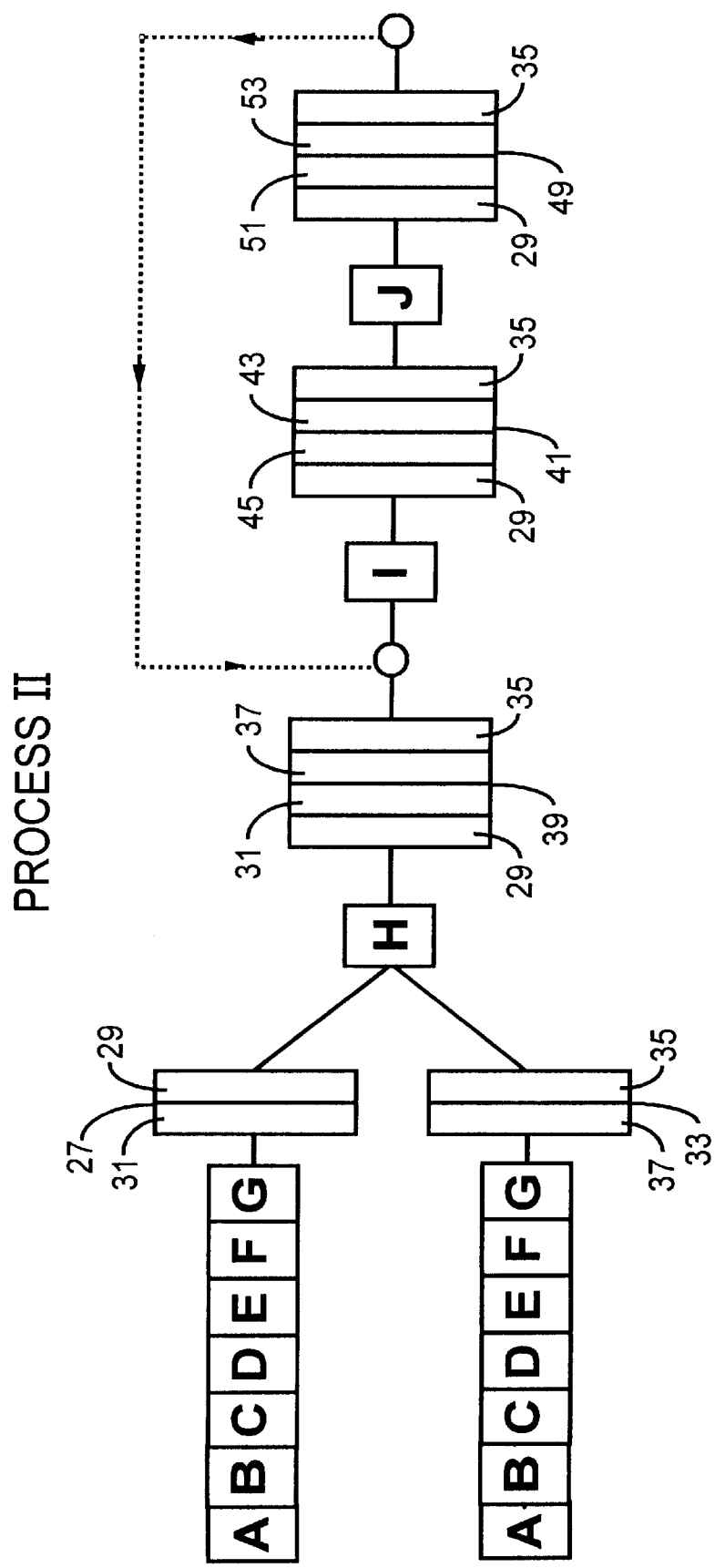
FIG. 4. Process schematic detailing construction of metal-ceramic-ceramic-metal composite sheet structures under the invention.

Process II (see FIG. 4) utilizes a compression step "H" to mechanically bond two articles 27 and 33 formed using some or all of steps "A" through "G" to produce a composite article 39 comprising ceramic layers 31 and 37 between two metal substrates 29 and 35. The article 27 used to form article 39 is comprised of a substrate 29 with an amorphous, partially crystallized, or fully crystallized ceramic coating 31. Article 33, which is mechanically bonded to article 27 in step "H", is comprised of an amorphous, partially crystallized, or fully crystallized ceramic layer 37, which may or may not have the same chemical composition as 31, on a substrate 35 that may or may not have the same composition of matter as 29. Mechanical bonding in step "H" is achieved by mechanical swaging, cold rolling, or hot pressing articles 27 and 33 ceramic face to ceramic face.

A reaction step "I" is then used to produce an article 41 in which the ceramic layers of article 39 have been evolved to a state of further crystallization, to produce partially or fully c-axis crystallized ceramic layers 43 and 45 between substrates 29 and 35. An optional compression step "J" is used to mechanically work article 41 to produce an article 49 that comprises ceramic layers 51 and 53 that may be partially or fully c-axis oriented crystallized in a state of greater densification and more uniform c-axis orientation.

The option exists to cycle article 49 through repeated steps "I" and "J" to increase the state of crystallization, density and c-axis orientation of the ceramic layers.

Figure 5:
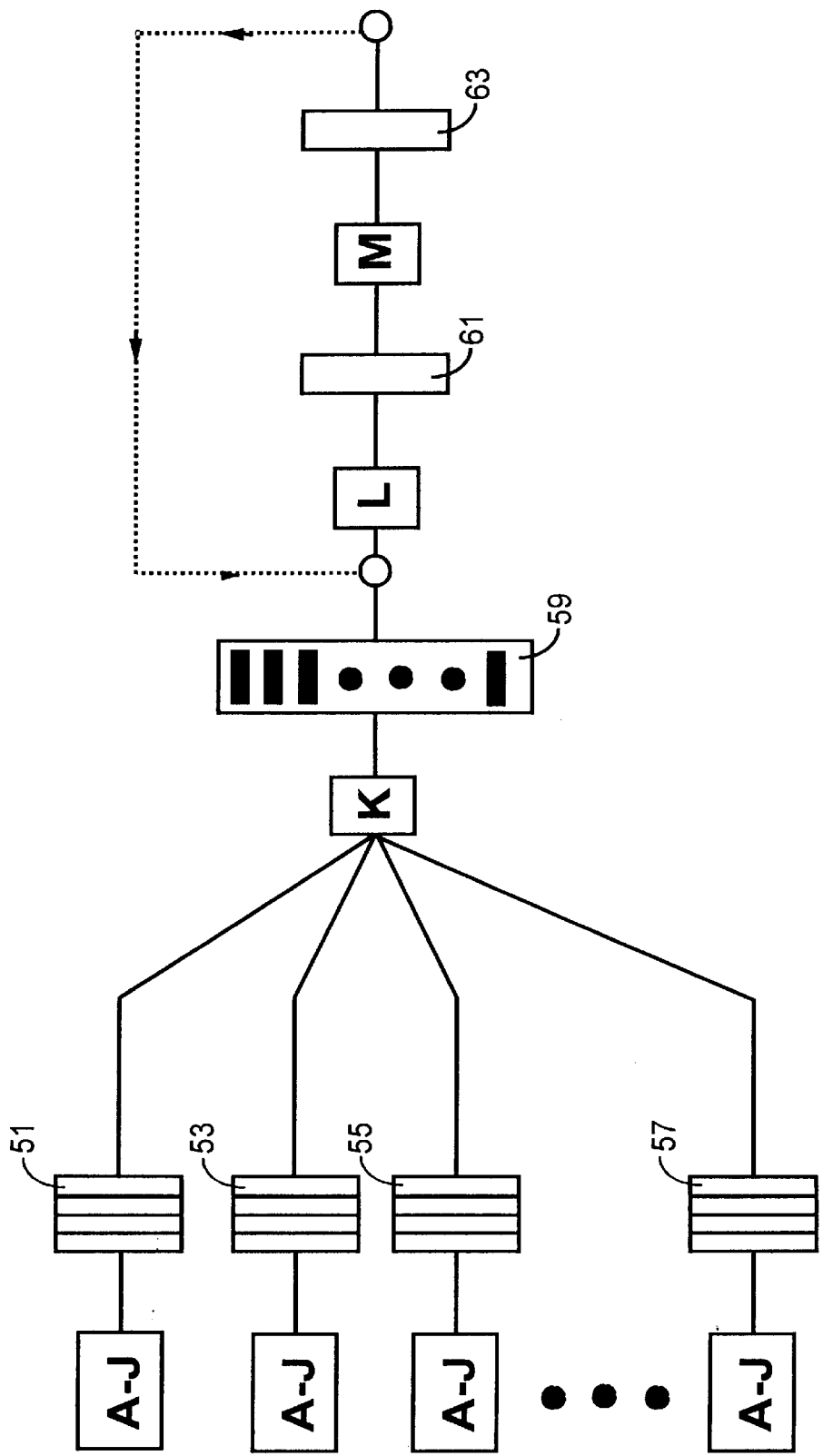
FIG. 5. Process schematic detailing the construction of a metal-matrix composite containing c-axis textured ceramic filaments.

Process III (see FIG. 5) utilizes a single article 51, or multiple articles 51–57, or more such articles, produced using steps "A" through "J" as filamentary components worked into a metal matrix to produce composite sheet or wire structures in which the c-axes of the individual ceramic filaments have been imparted crystallographic orientation relative to one another, or relative to a transverse axis of the composite structure. This is accomplished in process step "K" such articles 51–57 are discretely assembled or continuously with or without other metal filaments in any cross-sectional geometric form and wrapped with a metal sheath to form the metal matrix composite described by article 59.

A method for embedding c-axis textured sheets into a larger silver metal matrix is a preferred embodiment of this invention. Articles 51 through 57 are mechanically worked into a configuration of suitable c-axis filamentary architecture. Metallic or ceramic composite space filaments can be added to the composite to adjust relative filament spacing(s) to conform to the design intended for the composite. A silver sheathing can then be wrapped around the assembly and close the composite at a silver-silver sheathing. This process step is compatible with the manufacture of continuous composites of indefinite length since each of the filaments can be drawn from a payout spool and spiced into longer lengths before being placed in the silver casing. The use of fine silver particles to form an hermetic seal at such a silver-silver seam is a preferred embodiment of this invention. These fine particles can be applied to the surfaces of the sheathing material using a silver loaded epoxy, paste, slurry, or electroless plating compound. They are adhered to the surface of the silver by either curing and firing the epoxy or paste, or by drying the slurry. The surface activity of these fine silver particles is enhanced by their small dimension. Once the seam has been mechanically pressed, these fine particles can be recrystallized at relatively low temperatures (650–750° C.) to hermetically seal the seam.

An optional step "L" is used to discretely or continuously alter the shape of article 59 by mechanical deformation or extrusion into topological sheet structure or an elongated wire form, described as article 61, or any other type of structure that can be made working or winding such article 61.

An optional step "M" is used to anneal article 61 to produce article 63 comprised of a metal matrix composite with ceramic filamentary components that have been imparted c-axis orientation relative to one another or a transverse axis of the composite, wherein the annealing step is used to re-crystallize one or all ceramic components and or to reduce mechanical stress or metal fatigue in one or all of the metal filamentary components.

Process III includes the option of repeating steps "L" and "M" until the desired shape or form of the metal matrix ceramic composite described by article 63 has been made to satisfactory standards.

Figure 6:
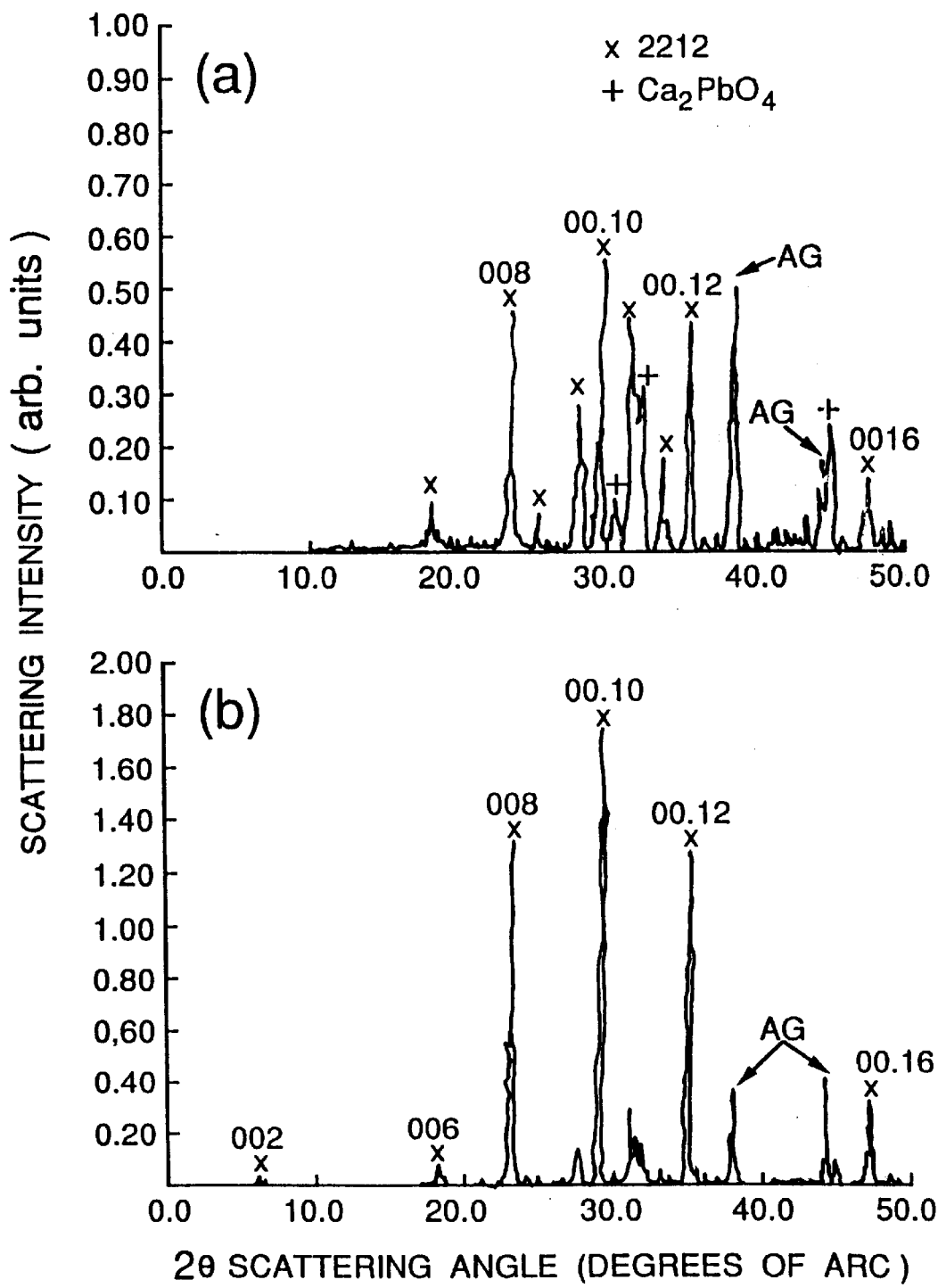
FIGS. 6(a) and (b). X-ray diffraction spectra displaying the lack of ceramic c-axis texture in a bulk Ag/$Bi_{1.68}Pb_{0.31}Sr_{2.20}Ca_{2.17}Cu_{3.06}O_{10-\delta}$/Ag composite filament after a 6 hour, 830° C. heat treatment and one intervening cold press (a); and the improvement in c-axis texture of intermediate phase $(Bi,Pb)_2Sr_2CaCu_2O_8$ ceramic, as measured by the intensity of the [0,0,1] diffraction peaks after prolonged thermomechanical processing treatments comprising two mechanical cold presses over a 15 hour treatment. The additional diffraction spectra is due to secondary phase calcium plombate $(Ca_2PbO_4)$ which reacts with intermediate phase $(Bi,Pb)_2Sr_2CaCu_2O_8$ during sintering to form $Bi_{1.68}Pb_{0.31}Sr_{2.20}Ca_{2.17}Cu_{3.06}O_{10-\delta}$ phase ceramic.

The term "thermomechanical processing" is understood to mean the repetitive application of mechanical pressure to the composite structure followed by short reaction treatments that increase ceramic density and incrementally crystallize the ceramic. It is a requisite and preferred embodiment of this invention. This processing feature is essential to forming c-axis oriented ceramic on a metal substrate without the use of an interfacial buffer, barrier, or surface layer that has a compatible crystalline structure to the deposited ceramic. Thermomechanical processing also increases conversion reaction rates in the ceramic. It is well known from the principles of thermodynamics the surface of a microstructure phase or the interface between microstructure phases is a region of high energy relative to the bulk. In order to maintain the lowest total energy for the system, the configuration of the surface adapts itself to minimize its excess energy. The repetitive action of mechanical pressure maximizes interfacial energies that are relieved during the reaction treatments until the ceramic achieves an equilibrium configuration throughout its bulk. Spinel, perovskite, ilmenite, and derivative crystalline structure that are anisotropic in their physical properties often have nucleation growth rates that are also anisotropic relative to a crystalline axis. This anisotropy in their crystallization rates causes crystalline phases to form with plate-like features, extended along the preferred directions of crystal growth. It is believed that the action of mechanical pressure also serves to organize plate-like grains in a closed-packed ordered structure with preferred crystalline orientation that cannot be engendered by the metal substrate alone. The discovery of this phenomenon is demonstrated in FIG. 6 and reported in P-21.

Thermomechanical processing can be broken into two steps, thermomechanical calcination and thermomechanical sintering. Thermomechanical calcination relates to the application of thermomechanical processing to an amorphous ceramic, whereby any remaining organic material is decomposed into its irreducible metal oxide components and redox reaction conditions are used to establish an oxidation potential and an intermediate microstructure phase chemistry among the oxides that later facilitates the formation of high quality c-axis oriented single phase ceramic during sintering. In the case of bismuth cuprate superconducting ceramic the preferred intermediate phases to the 110 K 2223 phase are the 80 K 2212 phase, copper oxide and calcium copper oxide, which must be formed at some point from the amorphous phase(s) of the ceramic. The invention of thermomechanical calcination allows c-axis textured 2223 ceramic to be produced from c-axis oriented 2212 ceramic on a metal substrate using the following reaction sequences:

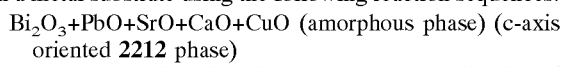

Thermomechanical sintering relates to the application of thermomechanical processing, redox conditions at reaction temperatures to fuse a distribution of intermediate phase ceramic microstructure(s) into the desired c-axis oriented (single) phase of the ceramic. In the bismuth cuprate superconducting ceramic system this aspect of the invention would be applied as:

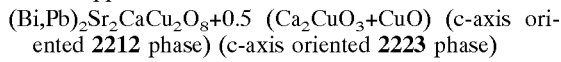

Thermomechanical calcination is a unique feature of this invention. Thermomechanical sintering of c-axis oriented intermediate phases on a metallic substrate to form a fully equilibrated c-axis oriented ceramic oxide on a metallic substrate is also a unique feature of this invention. For superconductivity to be technologically useful superconducting materials must be embodied within an environment that allows them to sustain the superconducting state. This state is operative within a range of physical parameters defined by temperature, the electrical current density passing through the superconductor, and the intensity of an applied or self-generated magnetic field. If any region of the superconductor is exposed to temperatures, magnetic filed intensities, or current densities beyond critical thresholds, energetic disturbances are thermally dissipated in the superconductor, causing its local temperature to rise. If the heat generated by the disturbance is not drained quickly enough, the region will revert back to its state of normal resistance. Current passing through the normally resistive region will start to generate greater heat through resistive heating, which, if not quickly transported away from the superconductor can cause catastrophic failure, even along the entire length of an elongated superconductor. The energetic disturbances that can trigger catastrophic failure have two root causes. They may originate from the release of mechanical energy that builds up as a result of electromagnetic forces acting upon mechanical components, or the result of magnetic flux jumping within the superconductor.

A preferred embodiment of superconductors is to introduce them as filamentary components within a metal composite structure. The composition of the metallic matrices surrounding the superconductor is selected to have intrinsic properties, such as heat capacities and thermal conductivities different than the superconductor, that allow heat generated within the superconductor to be quickly transported to a cooling reservoir without significantly increasing the temperature of the composite. The composite structure may also contain elements that act to improve the mechanical integrity of the composite under the effect of electromagnetic forces without compromising the ability to thermally process ceramic within a metal matrix composite. Another means to improve the performance of the superconductor is by reducing the movement of magnetic lines of flux within it. High-$T_c$ superconductors are not as successfully applied to conventional embodiments due to the crystallographic anisotropy in their superconducting properties. The superconducting state is more easily ruptured if magnetic lines of flux are oriented perpendicular to the c-axis of the ceramic. This state is much more easily ruptured by flux jumping when the field is oriented parallel to the ceramic c-axis, particularly at temperatures greater than 10–15 K in bismuth cuprate ceramic.

Figure 7:
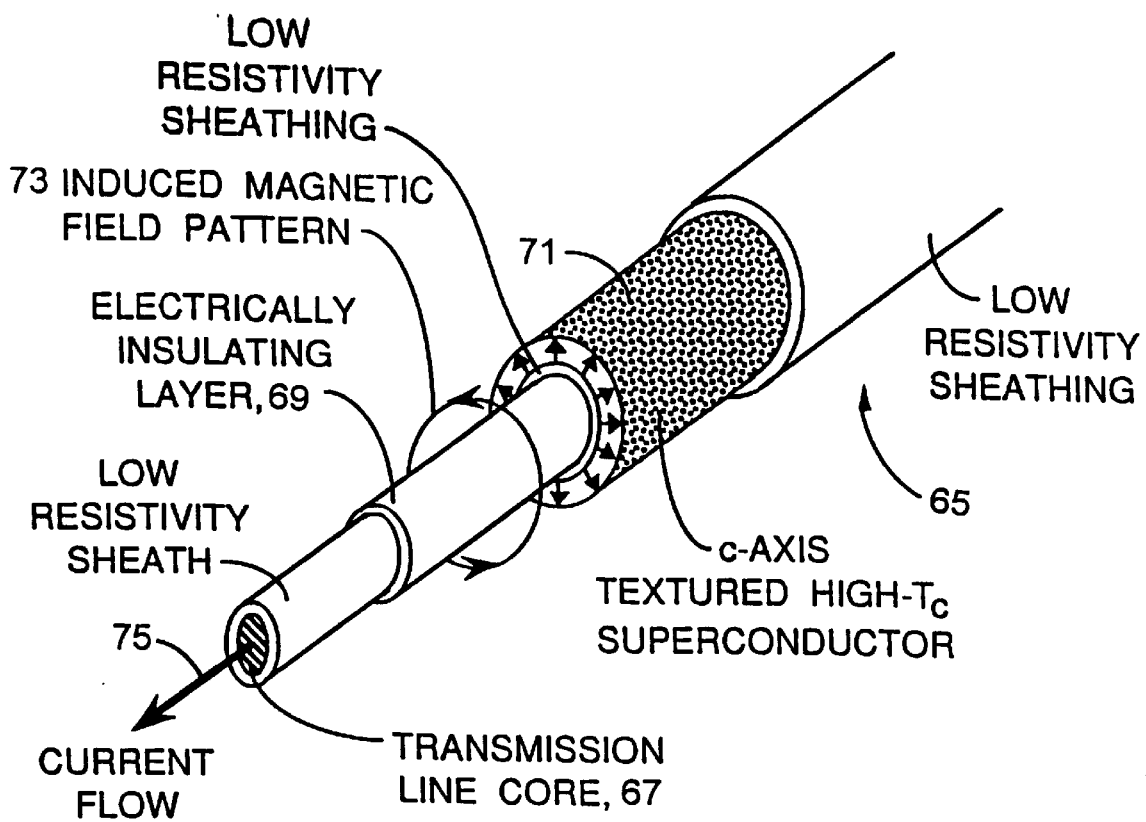
FIG. 7. Preferred embodiment of a transmission line with a high-$T_c$ superconducting ground plane that has its ceramic c-axis oriented perpendicular to the magnetic field induced by current flowing in the line.

Therefore, it is a preferred embodiment of this invention to construct composite structures from high-$T_c$ superconducting ceramic filaments that have had their c-axes oriented perpendicular to the magnetic lines of flux anticipated from the technological application. Given the orientation of magnetic lines of flux induced by the direction of current flowing through a composite body, it is now possible to use this invention to construct a composite structure with improved electromagnetic properties. FIG. 7 shows an architecture useful as a transmission line 65 containing a high-$T_c$ superconducting ground plane. Such a composite structure would have a superconducting transmission line core 67, surrounded by concentric filamentary components, at least one of which acts as an electrical insulator 69. An outer filamentary component 71 acts as the ground plane and contains high-$T_c$ superconducting ceramic with its c-axis oriented in the radial directions of the composite conductor and perpendicular to the magnetic field lines 73 generated by currents flowing in the core 67 of the transmission line. This structure is constructed by cutting a width of c-axis textured metal-ceramic composite sheet 51 to match the radial circumference of the transmission line and mechanically wrapping the sheet as a continuous casing around the transmission line. This method of construction orients the c-axis of the ceramic in the radial direction for the full 360° of arc about the longitudinal axis of the transmission line. The ground plane c-axis is, therefore, oriented tangentially to the fields generated by longitudinal currents in the transmission line core.

Figure 8:
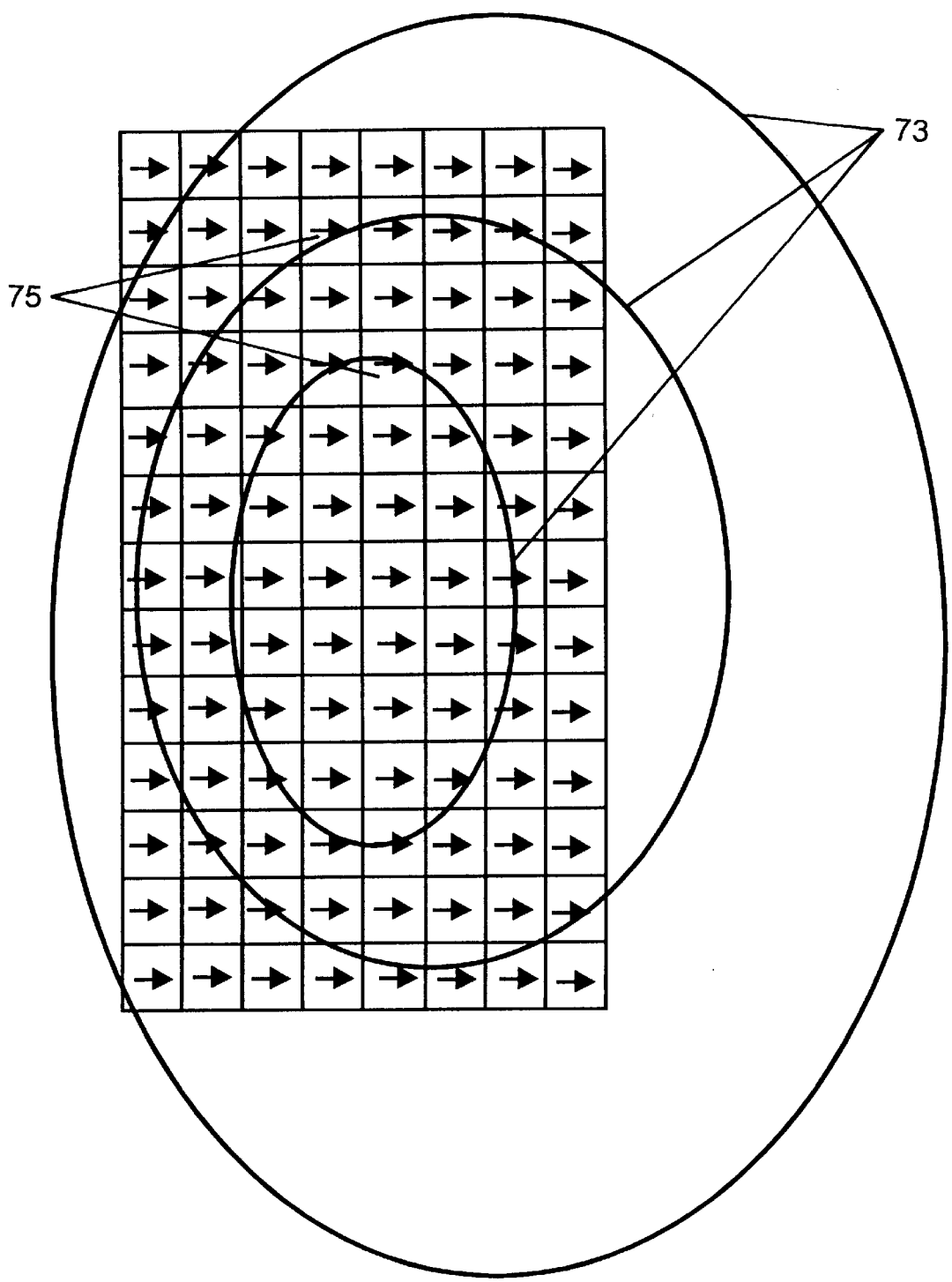
FIG. 8. Magnetic field pattern of a solenoid winding in the half plane made from wire (represented by rectangular grids) with uni-directionally c-axis oriented ceramic filaments (arrows) is sensitive to energetic disturbances generated by the parallel alignment of the induced magnetic field with the c-axes of the superconducting ceramic filaments at the poles of the magnet.
Figure 9:
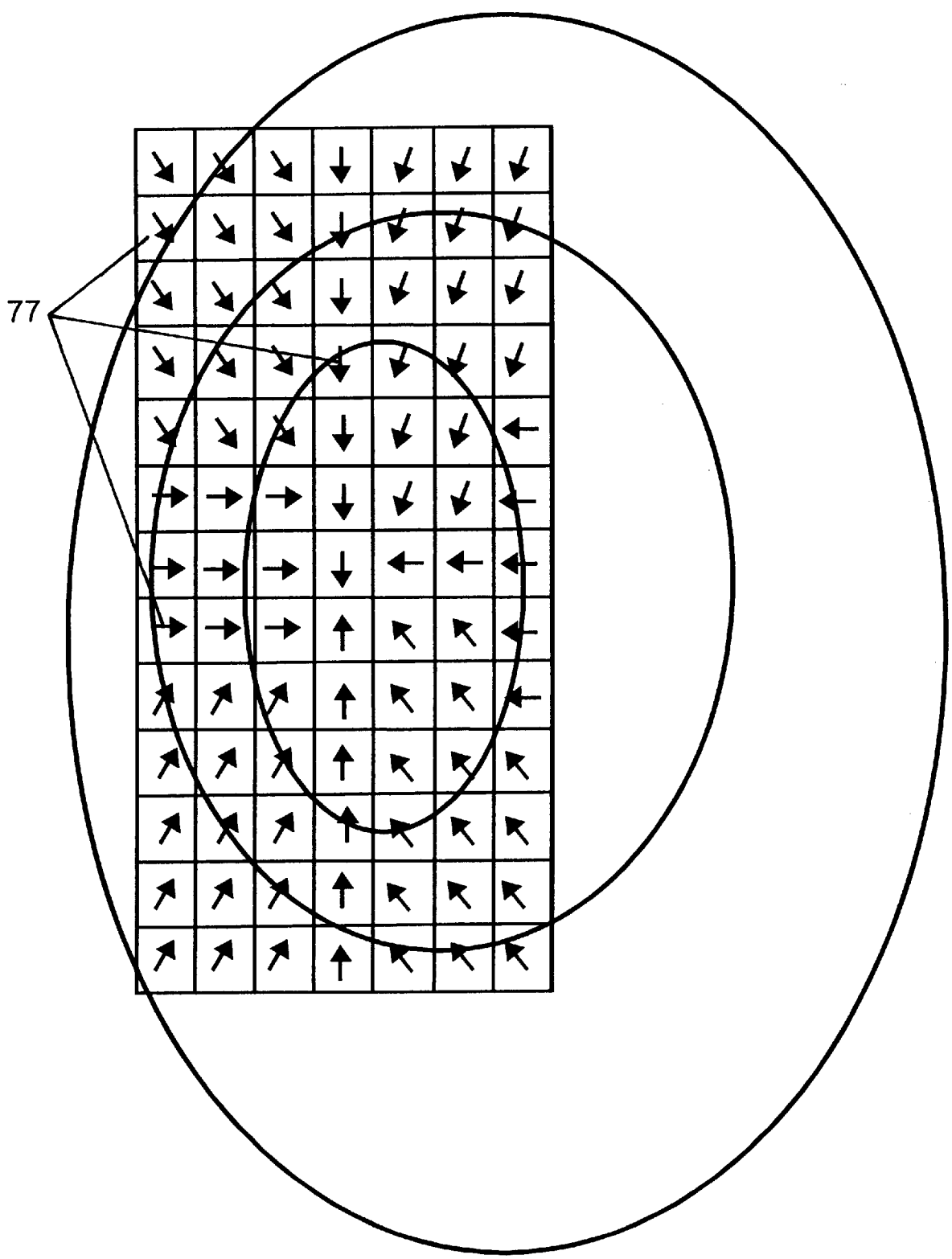
FIG. 9. Magnetic field pattern of a solenoid winding in the half-plane made from wire (rectangular grids) in which the c-axis orientation of ceramic filaments can be controlled relative to a transverse axis of the wire versus the wire's length to produce windings in which energetic disturbances are reduced by the perpendicular alignment of the induced magnetic field with the c-axes of the superconducting ceramic filaments throughout the magnet.

It is straightforward to demonstrate how this technique can be applied to composite structures deployed in more complicated field environments. FIG. 8 shows lines of magnetic field 73 generated by a solenoid winding. The field is generated by current running along the conductor winding with rectangular cross-sectional area (grid in FIG. 8), and is depicted as flowing into the page. As shown, the magnetic field pattern of this solenoid configuration can cause intense radial field components located at the poles of the solenoid. If this solenoid is constructed with ceramic filaments that have unidirectional c-axis orientation versus length the composite will be susceptible to energetic disturbances generated at the poles where the induced magnetic flux lines run parallel to c-axis (arrows in grid) of the ceramic filaments 75. This invention allows a series of looped current paths to be formed in which the relative orientation of the filamentary ceramic c-axes within the wire is varied along the wire's length with respect to a principal transverse axis of the wire. It is contemplated that control of the c-axis orientation of ceramic filaments inserted within a wire will allow a solenoid to be wound that will be less sensitive to magnetic flux movements (flux jumping) in the presence of magnetic fields generated by the solenoid because the c-axes of the individual filaments have more favorable alignments with the induced magnetic field pattern 77, FIG. 9. Designs similar to this, or designs that require the c-axes of individual filaments to be oriented differently relative to one another across a cross-sectional face of the wire, can improve high-$T_c$ superconductor performance at temperatures above 15 K.

It is, additionally, a preferred embodiment of the invention to construct metal-ceramic-metal structures that improve thermal management of energetic disturbances in the composite structure or its mechanical integrity. This is achieved by forming an article 51 that has one silver metal layer, required for redox processing of bismuth cuprate ceramic, and another metal layer with intrinsic physical properties, such as Young's modulus, heat capacity, or thermal conductivity, that stabilize the performance of a superconductor filament in the composite. When structures such as this are embedded within a silver composite matrix, it is then possible to mechanically or thermally stabilize the ceramic filament with the metal on one of its sides, and still provide an oxygen diffusive pathway between the ceramic and composite's exterior through the silver on the other side of the filamentary article.

The transition temperatures of high-$T_c$ superconductors are known to increase when a compressive force is applied to the ceramic. This property allows higher thermodynamic loads, currents and magnetic field intensities, to be applied to these ceramics when they are in a state of compression. This invention can be used to manufacture composite structures using ceramics with magneto-sensitive or piezoelectric properties, that will place the superconducting ceramic filaments into a state of compression. The crystallographic dimensions of the ceramics are known to change when under the influence of a magnetic or electrical field, respectively. The amount of dimensional change in these ceramics is a function of the ceramic composition, the applied field strength, and its relative orientation to the crystallographic c-axis of the ceramic. Some materials are active along their c-axis, while others exhibit this property in the a-b plane. As they expand (or contract) in one crystallographic orientation, they contract (or expand) in the perpendicular plane. Composites containing c-axis textured filaments with these properties can be used to apply compressive loads to superconducting filaments. It is contemplated that this invention can be used to apply compressive loads to superconducting filaments, if suitably configured. Therefore an embodiment of this invention includes its use to manufacture ceramic filaments that can directionally alter compressive stresses on other components in a larger composite structure. All the above preferred embodiments intended to improve the electromagnetic stability on high-$T_c$ superconducting ceramic filaments in elongated wire structures improve the performance of magnetic energy storage devices that are based on using superconducting solenoids and superconductors to store and transport electrical current.

Figure 10:
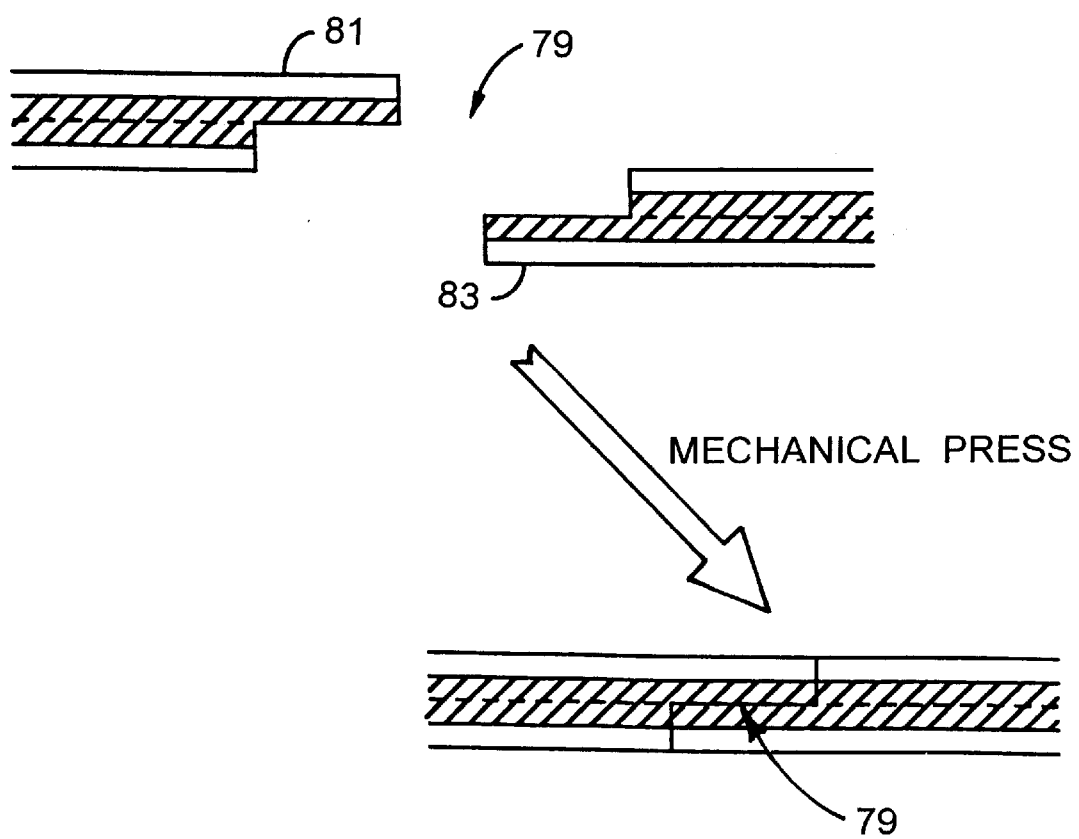
FIG. 10. Spliced joint in a metal/ceramic/metal composite structure.

Another embodiment of this invention, FIG. 10, allows smaller composite sheet structures to be spliced into larger sheet without disrupting the continuity of the ceramic layer, or to use a splice joint 79 to form a closed ceramic or superconducting surface topology from a single sheet of composite. Spliced joints with a continuously interconnected superconducting layer are easily formed using the sandwiched metal/ceramic/metal composite structures. This is achieved by allowing one of the metal-ceramic sheets, article 27, to form a sandwich structure with an edge 81 that overhangs over the side of the other metal-ceramic sheet, article 33, to which it is attached. This overhanging edge can be mated with an underhanging edge 83 from another sandwich structure and mechanically pressed together.

Figure 11:
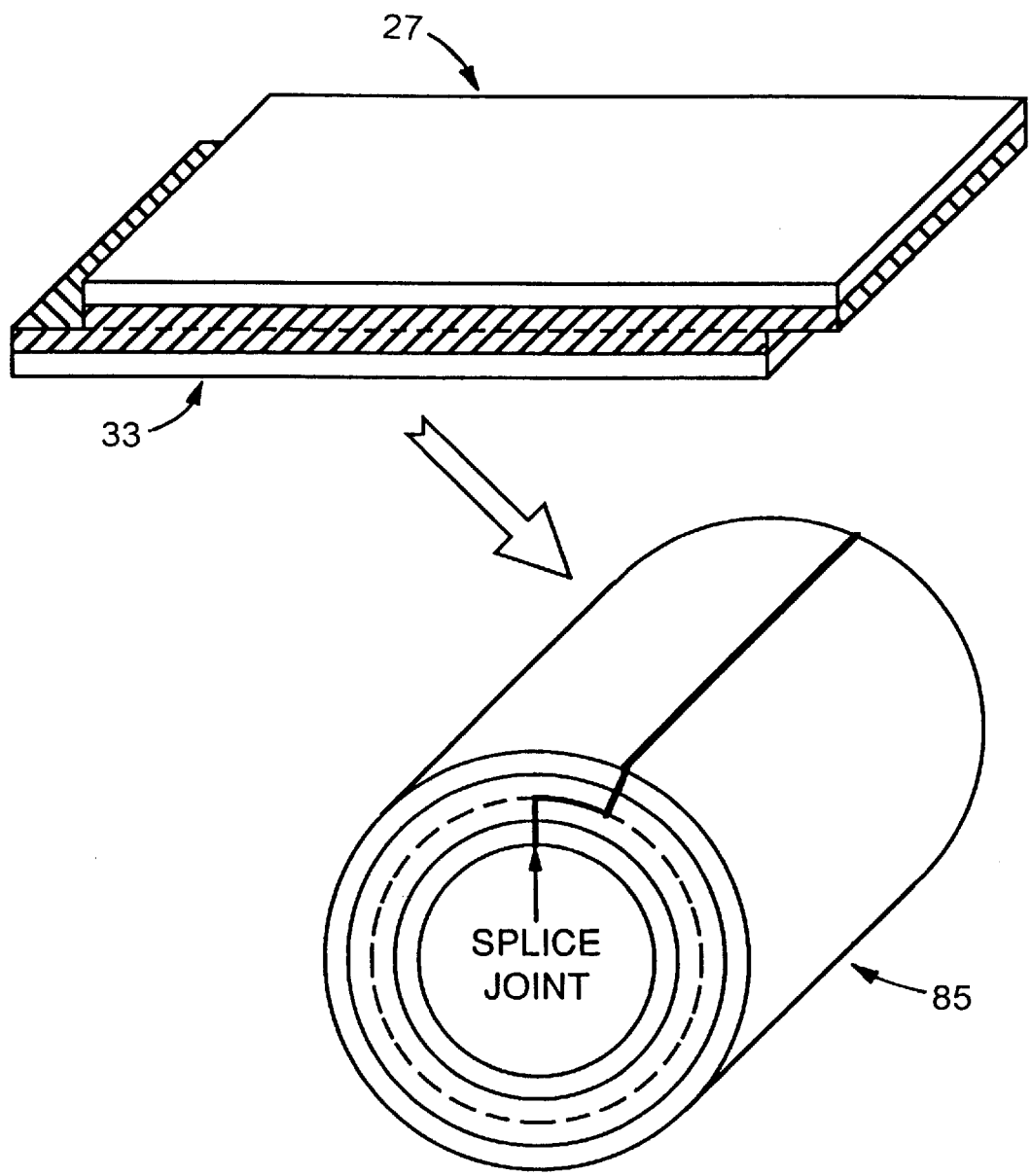
FIG. 11. Utilizing splice joint technology to form a closed topological surface from a single composite sheet.

FIG. 11 shows how a continuous closed ceramic topological surface, in this case a cylinder 85, can be constructed from a single composite sheet. The sheet sandwich structure is constructed using two metal-ceramic composite sheets, article 27 and 33, of equal surface dimensions. The top sheet is laterally displaced from the bottom sheet along one direction, causing it to overhang on one side and to underhang on the other. The sheets are mechanically pressed and wrapped into a cylinder where the overhanging edge mates with the underhanging edge. An additional press along the seam closes the ceramic loop. This embodiment allows the invention to be used as electromagnetic shielding device when the ceramic layer comprises a superconducting ceramic layer. A continuous surface of such a composite can be used to envelope a body. The closes body is shielded from electromagnetic radiation through the Meissner-Oschenfeld effect when the ceramic superconducting layer is cooled below its critical transition temperature.

It is a requisite and preferred embodiment of this invention to use carboxylate salts as the metalorganic precursors. Implicit to the selection of the carboxylate ligand is the ability of the compound to exert strong electrostatic forces that maintain ultrafine subdivision of the precursors within a lattice of carboxylate salts after the solvent has been evaporated from a droplet. The suitability of the organic ligand can be defined in terms of its molecular structure. Preferred carboxylate ligands will have at least one carboxylic acid group attached to an alkyl or aryl chain, wherein said alkyl or aryl chain will consist of between 4 and 30 carbon atoms. Carboxylate ligands with less than 4 carbon atoms are prone to phase separate. Carboxylate ligands with more than 30 carbon atoms severely restrict the metals content in the precursor solution. The use of carboxylate ligands with between 6 and 15 carbon atoms is a preferred embodiment of this invention. Other than the technique used to simultaneously co-react alkaline earth metals with the carboxylate ligand described above, methods to attach other metal ions to a carboxylate ligand are well known to practitioners of the art.

The selection of the solvent is also an important criteria to preparing the metalorganic precursor solution. As described above, the ideal solvent will dissolve all the carboxylate precursor salts and volatilize readily from a liquid droplet during aerosol spray deposition. The selection of such an organic solvent is well known to practitioners in the art. Such a solvent may even be a carboxylic acid. Nuclear magnetic resonance (NMR) analysis has shown that these carboxylic acid salt complexes exist as free ions in solution. If the solvent is a carboxylic acid that is chemically different from the carboxylate ligand(s) attached to the metal ions, the solvent molecule may exchange positions with the metalorganic precursor ligand and alter the thermal decomposition temperatures of the metalorganic precursors. It is, therefore, a preferred, but not a requisite embodiment of this invention to use the carboxylic acid that forms the thermally sensitive ligand to the different metals as the organic solvent to control stoichiometry in the deposited layer if an organic acid is used as the solvent.

A specific preferred embodiment of this invention relates to the use of process applications I–III, or any portion thereof, in the preparation of Bi—Sr—Ca—Cu—O ceramic on metal substrates without the use of an external bonding agent or an interfacial barrier, buffer, or surface layer between the ceramic and the metal substrate. One specifically preferred class of Bi—Sr—Ca—Cu—O articles are those having metal cation distribution with molar concentrations in the range:

$$Bi_{1.60-2.00}Pb_{0.00-0.40}Sr_{2.00\pm0.20}Ca_{0.90-2.10}Cu_{1.95-3.15}. \quad (4)$$

Other preferred embodiments of this invention relate generally to the use of process applications I–III, or any portion thereof, in the preparation of articles comprising ceramic layers that are characterized by piezoelectric, insulating, electrically conducting, or magneto-sensitive properties. The use of such articles as filamentary components to stabilize the electromagnetic performance of high-$T_c$ superconducting filaments is also a preferred embodiment of this invention. The fabrication of such ceramic articles that require direct contact to metal layers and uniform c-axis orientation to optimize the performance of a key characteristic that is essential to the function of such a ceramic layer is an obvious extension of this invention, achieved by depositing ceramic layers of suitable composition and by adjusting the reaction treatment(s) to properly crystallize such articles. Ceramics that have such physical properties with efficiencies that are improved by uniformly orienting the c-axis within the ceramic layer are generally known to have spinel, perovskite, ilmenite or derivative crystalline structures.

A preferred class of insulating spinel ceramics to this invention satisfy the formula:

$$AE_1Al_2O_4 \quad (5)$$

where AE is an alkaline earth element.

Preferred classes of magneto-sensitive normal spinel and inverse spinel ceramics to this invention satisfy the formulas:

$$TMFe_2O_4 \quad (6)$$

where TM is a first-row transition-metal element, and:

$$FeMFeO_4 \quad (7)$$

where M is a magnesium (Mg) or a first-row transition-metal, or:

$$ZnSnZnO_4. \quad (8)$$

Preferred classes of insulating perovskite ceramics to this invention satisfy the formulas:

$$(M_1)_1(M_2)_1O_3 \quad (9)$$

where $M_1$ represents one or more alkaline earth or rare earth elements or lead, and $M_2$ represents zirconium (Zr), titanium (Ti), or tin (Sn).

Preferred classes of insulating ilmenite ceramics to this invention satisfy the formula:

$$(M_1)_1(M_2)_1O_3 \quad (10)$$

where $M_1$ represents Mg, or a first-row transition-metal element, and $M_2$ represents Ti,; or $M_1$ represents an alkali element and $M_2$ represents niobium.

A preferred class of magneto-sensitive ceramic to this invention contains oxides of magnesium and rare earth elements that satisfy the formula:

$$RE_2MgO_4, \quad (11)$$

where RE is a rare earth element.

A preferred class of electrically conducting ceramic to this invention contains oxides of indium and tin.

EXAMPLES

Details of the preparation and performance of articles according to this invention are illustrated by the following examples, which were demonstrated in the laboratory.

Precursors

Two methods are employed to prepare precursor solutions that are subsequently spray pyrolyzed to form ceramic deposits on silver.

Method I: The Sequential Reaction Method

The following generally describes methods used under the sequential reaction method.

This method simultaneously co-reacts elemental calcium and strontium with a carboxylic acid solvent. The weights of each element introduced into solution will vary depending upon the desired stoichiometry and solids content of the solution. Calcium shot is weighed and introduced into in excess of 175.0 gms of 2-ethylhexanoic acid. The calcium shot is partially reacted by heating the solution to 140° C. for 10 minutes until the solution becomes a steely gray colored brackish liquid. It is preferred not to form a clear transparent solution, but to terminate the reaction while the liquid contains a fine calcium metal particle suspension and is still opaque. The solution is returned to room temperature, strontium shot is introduced, and the solution is reacted with both the metals through to completion by heating in excess of 160° C., but less than 200° C. for twenty minutes. A clear amber-colored solution is formed without any trace of metal particles. Bismuth, lead, and copper are sequentially introduced as acetates and exchange reacted to form 2-ethylhexanoates by heating the solution to temperatures in excess of 160° C. but lower than 200° C. and distilling acetic acid from the solution. The solution is vacuum distilled after all the elements are introduced.

Method II: The Stock Solution Method

Greater control over solution stoichiometry is achieved by assaying individually prepared solutions of the precursors, and then mixing the individually prepared stock solutions in measured quantities to form a precursor batch solution. The solution reaction procedures are the same, except every solution is driven through to completion. Calcium is shot is reacted at temperatures greater than 160° C., but less than 200° C., for 30–45 minutes, instead of just 10 minutes at 140° C. to complete the reaction. A transparent greenish-yellow or brown solution is formed. Strontium, bismuth, lead, and copper are reacted without any other element in solution. The two reaction methods can are also used to prepare other precursor solutions. Transition-metals and the more electropositive metals are more easily reacted as hydrides than acetates using similar procedures to those used for the alkaline earth metals. Ligands of other carboxylic acids, such as butyrates, napthenates, and neodecanoates, are formed by using butyric acid, napthenoic acid, neodecanoic acid instead of 2-ethylhexanoic acid.

Example 1

A filament is coated with 2223 bismuth cuprate solution prepared using the sequential reaction and placed in a diffuse reflectance infrared Fourier-transform (DRIFT) spectroscopy cell. The coated filament is slowly heated to pyrolyze the solution and the decomposition products are analyzed during pyrolysis. Infrared spectra is generally considered to be sensitive to within 5–10 ppm. No carbonate phase spectra is observed after the coated filament is heated to 500° C. Droplets of a 2223 bismuth cuprate solution prepared using the stock solution method is analyzed using thermogravimetric analysis (TGA), and observed to decompose significantly through carbonate phases. TGA analysis shows that all these carbonates are decomposed into oxides only after a 1½ hour thermal soak at 820° C. in flowing oxygen. DRIFT analysis performed on residues before and after the thermal soak confirm the formation and subsequent decomposition of carbonate phase material, respectively.

Example 2

A 2223 bismuth cuprate solution is prepared using the stock solution method and spray pyrolyzed onto silver sheet heated to 375° C. to form a granular porous ceramic coating that is 1 mm thick. The composite is heated to 800° C. in pure oxygen for 1 hour. A sample is cut from the composite and analyzed using superconducting quantum interference device (SQUID) magnetometry, which shows a paramagnetic signal at 50 K and a diamagnetic signal at 25 K, with a stronger diamagnetic signal at 4 K. The composite is then heat treated at 830° C. in pure oxygen for an additional 3 hours. A sample is cut from the composite and analyzed using SQUID magnetometry, which shows a diamagnetic signal at 25–30 K and no paramagnetic signal. The sheet composite is cut into four filaments of equal size. Two metal/ceramic/metal filaments are formed from the four metal/ceramic filaments by pressing the two together ceramic face-to-face at a pressure of 27 kpsi. These two filaments are heat treated for an additional 3 hours in pure oxygen at 830° C. A sample is cut from the one of the filaments and analyzed using SQUID magnetometry, which shows a diamagnetic signal with an onset at 75 K that is an order of magnitude stronger than the previous measurement. These two filaments are packaged in a silver sheath using fine silver particles to form a hermetic seal, mechanically deformed into an elongated tape wire by cold rolling, and sintered for 57 hours in 7% oxygen in a nitrogen balance at 830° C. A sample is cut from the multiple filament tape and analyzed using SQUID magnetometry, which shows a weak diamagnetic signal with an onset at 108 K, and a very sharp increase in the diamagnetic signal at 75 K. Energy dispersive x-ray spectroscopy of the sintered tape reveals minor 2223 phase formation, with random c-axis texture, majority 2212 intermediate phase formation, and copper oxide (CuO) and calcium copper oxide ($Ca_2CuO_3$). Scanning electron microscopy (SEM) reveals filament thickness of 20 microns after deformation and sintering. Partial liquid phases of the ceramic that are normally generated during sintering do not leak through the seam sealed with the fine silver particles, demonstrating the hermetic seal. Extrinsic critical current density is measured at $8\times10^3$ $A/cm^2$ at 4 K, intrinsic critical current density is measured at $2\times10^4$ $A/cm^2$.

Example 3

A 2223 bismuth cuprate solution is prepared using the stock solution method and spray pyrolyzed on a silver sheet heated to 375° C. thick to form a porous granular amorphous ceramic deposit 2 mm thick. The composite is heat treated at 830° C. in an oxygen atmosphere for 3 hours, and cut into filaments, which are pressed together under a pressure of 27 kpsi to form metal-ceramic-metal filaments. After the press, the composite is heat treated for another 3 hours at 830° C. in pure oxygen. A sample is cut from the composite, one of its silver layers is peeled back to expose the ceramic layer after it is heat treated for a total of 6 hours at 830° C. in oxygen. The ceramic layer, roughly 150 microns thick, is analyzed using scanning x-ray diffraction (XRD) and found to be majority phase 2212, most of which has randomly oriented c-axis texture, with some c-axis orientation, and has calcium plombate as its principal second phase. The composite is heat treated for an additional 6 hours at 830° C. (for a total of 12 hours) in oxygen and then mechanically pressed at 27 kpsi, and heat treated for an additional 3 hours at 830° C. (for a total of 15 hours) in oxygen. A sample is cut from the composite, one of its silver layers is peeled off, and analyzed using scanning XRD, and found to be majority phase c-axis oriented 2212 intermediate phase, with calcium plombate as the principal secondary phase. The filament is sheathed in a silver matrix, deformed into elongated wire tape by cold rolling, and sintered for 57 hours in 7% $pO_2$ at 830° C. SEM analysis shows much larger grain sizes than previously observed in Example 2 and c-axis texture. XRD powder patterns show the sample contains 19% 2223 phase material.

Example 4

A section of the composite prepared in Example 3 is formed into a silver/ceramic/silver filament by a 27 kpsi press after a 3 hour heat treatment at 830° C. in oxygen, and heat treated for an additional 45 hours for a total heat treatment time of 48 hours at 830° C. in oxygen with only one swaging treatment. The filament is embedded in a silver matrix using the fine silver particle technique, deformed into an elongated tape wire, and sinter reacted for 57 hours in 7% $pO_2$ at 830° C. SQUID magnetometry shows this sample to have a lower critical transition-temperature than samples prepared in Example 2 and Example 3. SEM analysis shows poor c-axis texture.

Example 5

A 2223 bismuth cuprate precursor solution is prepared using the stock solution method and spray pyrolyzed on to a silver sheet heated to 375° C. to form a ceramic deposit roughly 3 mm thick. The composite is heat treated in oxygen at 830° C. for 3 hours, cut into filaments that are pressed together using a mechanical swage at 27 kpsi to form a silver/ceramic/silver filament. The filament is then repetitively heat treated for 3 hours at 830° C. in pure oxygen, and mechanically pressed at 27 kpsi 5 times, for a total heat treatment of 18 hours with 6 mechanical swaging treatments. The filament is embedded in silver using the fine particle method, deformed into an elongated wire tape by cold rolling, and sinter reacted for a total of 100 hours in 7% $pO_2$ at 820° C. SEM analysis shows the filament to have a thickness of roughly 70 microns and c-axis texture. SQUID magnetometry shows the onset of a weak diamagnetic signal at 104 K, with a strong enhancement in the signal at 75 K.

Example 6

A 2223 bismuth cuprate precursor solution is prepared using the stock solution method and spray pyrolyzed on to a silver sheet heated to 375° C. to form a ceramic deposit roughly 5 mm thick. The composite is heat treated in air (20% $pO_2$) at 840° C. for 3 hours. Some material loss is observed due to the creep of a partial liquid phase. The composite is cut into filaments that are pressed together using a mechanical swage at 27 kpsi to form a silver/ceramic/silver filament. The filament is then repetitively cycled 3 times through 3 hour heat treatments in air at 820° C. with a 27 kpsi mechanical press at the end of each treatment, followed by a repetitive cycling (2 times) through 3 hour heat treatments at 815° C. in air with a 27 kpsi mechanical press at the end of each treatment, for a total heat treatment time of 18 hours at temperatures decreasing from 840° C. to 815° C. with 6 mechanical swaging treatments. SQUID magnetometry on a sample cut from the filament after thermomechanical calcination shows the onset of an intermediate strength diamagnetic signal at 108 K, with a strong enhancement in the signal at 80 K at the end of the stage of processing. The filament is embedded in silver using the fine particle method, deformed into an elongated wire tape by cold rolling, and sinter reacted for a total of 100 hours in 7% $pO_2$ at 820° C. SEM analysis shows the filament to have a thickness roughly over 100 microns, with very large grain sizes and c-axis texture. SQUID magnetometry shows the onset of a strong diamagnetic signal at 109 K, with the presence of some secondary phase enhancement in the signal at 80 K. XRD powder patterns showed this sample to be composed of 69% 2223 phase ceramic, despite the material loss.

Example 7

A 2223 bismuth cuprate precursor solution is prepared using the stock solution method and spray pyrolyzed on to a silver sheet heated to 375° C. to form a ceramic deposit roughly 3 mm thick. The composite is heat treated in pure oxygen at 820° C. for 3½ hours to decompose strontium carbonate phases that form when using the stock solution method. The composite is cut into filaments that are pressed together using a mechanical swage at 27 kpsi to form a silver/ceramic/silver filament. The filament is then repetitively cycled 5 times through 3 hour heat treatments at 810° C. in 7% $pO_2$ with a 27 kpsi mechanical press at the end of each treatment, for a total heat treatment time of 18 hours with 6 mechanical swaging treatments. SQUID magnetometry shows the onset of a strong diamagnetic signal at 109 K after thermomechanical calcination. The filament is embedded in silver using the fine particle method, deformed into an elongated wire tape by cold rolling, and sinter reacted for a total of 100 hours in 7% $pO_2$ at 820° C. SEM analysis shows a filament thickness roughly over 60 microns, with very large grain sizes and c-axis texture. SQUID magnetometry shows the same strong diamagnetic signal at 109 K. Intrinsic critical current densities are measured to be on the order of $10^6$ $A/cm^2$ at 4.2 K, and $10^4$ $A/cm^2$ at 77 K. Extrinsic critical current densities are measured to be on the order of 250 $A/cm^2$ at 4.2 K, and could not be measured at 77 K. The discrepancy between the intrinsic and extrinsic critical current densities is assumed to be due to the pure oxygen atmosphere treatments required at the beginning of the process to decompose strontium carbonate phase material that results from using the stock solution method. These process conditions are now known to irreversibly nucleate electrically insulating phases that collect at the boundaries between superconducting grams.

The invention has been described in detail with particular reference to preferred embodiments thereof, but it will be understood that variations and modifications can be effected within the spirit and scope of the invention.

What is claimed is:

1. A metal oxide ceramic composite comprising,
   a) a metallic substrate and
   b) a densified ceramic layer made of dissolved metal organic precursors spray pyrolized onto said substrate to form a porous amorphous metal oxide ceramic layer thereon with ultra fine subdivision of precursors mixed at the molecular level, said ceramic layer being compressed to densify same.

2. A metal oxide ceramic composite comprising,
   a) a metallic substrate and
   b) an at least partially crystalized ceramic layer made of dissolved metal organic precursors spray pyrolized onto said substrate to form a porous amorphous metal oxide ceramic layer thereon with ultra fine subdivision of precursors mixed at the molecular level, said ceramic layer being thermomechanically calcined to densify and at least partially crystallize same, to define a c-axis oriented ceramic layer on said substrate.

3. The composite of claim 1 or 2 wherein said ceramic layer has a thickness of more than 1.5 microns.

4. The composite of one of claims 1 and 2, being in the form of at least one filament.

5. The composite of claim 2 wherein said ceramic layer is sintered to further crystallize and c-axis orient same.

6. A ceramic-metal composite comprising,
   a) a metallic substrate and
   b) a c-axis oriented ceramic layer that has been spray pyrolized onto said substrate with ultra fine subdivision of precursors mixed at the molecular level, which layer has a thickness of more than 1.5 microns.

7. The composite of claim 6 wherein said layer has a thickness of more than 2.5 microns.

8. The composite of claim 6 wherein said layer has a thickness of more than 50 microns.

9. A ceramic-metal composite comprising,
   a) a metallic substrate and
   b) a c-axis oriented ceramic layer that has been spray pyrolized onto said substrate with ultra fine subdivision of precursors mixed at the molecular level, which layer is compressed and densified.

10. A composite conductive assembly comprising
    a) a c-axis oriented ceramic tube,
    b) a metallic substrate tube mounted within said ceramic tube, and bonded directly thereto, to define a composite tube
    c) an insulative sleeve mounted within said substrate tube and
    d) a conductor mounted within said sleeve.

11. A metal oxide ceramic composite comprising,
a) a metallic substrate and
b) a porous amorphous metal oxide ceramic layer thereon formed by ultra fine subdivision of metal organic precursors mixed at the molecular level.

12. The composite of claim 11 being compressed and partially densified.

13. The composite of claim 12 being calcined and partially crystalized.

14. A metal oxide ceramic composite comprising, a porous amorphous metal oxide ceramic layer formed by
a) dissolving metal organic precursors in a solvent therefor,
b) heating a metallic substrate to a temperature sufficient to decompose at least one ligand of said precursors and to boil said solvent and
c) spray pyrolizing said metal organic precursors onto the surface of said metallic substrate to form the porous amorphous metal oxide ceramic layer thereon with ultra fine subdivision of precursors mixed at the molecular level.

15. A metal oxide ceramic composite comprising, a densified metal oxide ceramic layer formed by
a) dissolving metal organic precursors in a solvent therefor,
b) heating a metallic substrate to a temperature sufficient to decompose at least one ligand of said precursors and to boil said solvent,
c) spray pyrolizing said metal organic precursors onto the surface of said metallic substrate to form a porous amorphous metal oxide ceramic layer thereon with ultra fine subdivision of precursors mixed at the molecular level and
d) mechanically compressing said ceramic layer to at least partially densify same.

16. A metal oxide ceramic composite comprising, an at least partially crystallized metal oxide ceramic layer formed by
a) dissolving metal organic precursors in a solvent therefor,
b) heating a metallic substrate to a temperature sufficient to decompose at least one ligand of said precursors and to boil said solvent,
c) spray pyrolizing said metal organic precursors onto the surface of said metallic substrate to form a porous amorphous metal oxide ceramic layer thereon with ultra fine subdivision of precursors mixed at the molecular level,
d) mechanically compressing said ceramic layer to at least partially densify same and
e) thermomechanically calcining said ceramic layer to at least partially crystallize and c-orient same.

17. A laminate comprising, one formed by
a) mechanically compressing at least two composites of claim 14 to fuse same, ceramic layer to ceramic layer, to form said laminate and
b) applying thermomechanical calcination treatments to further crystallize said ceramic layers into intermediate phases with c-axis orientation, the corresponding layers of each composite being of the same or different compositions.

18. A laminate comprising, one formed by
a) mechanically compressing at least two composites of claim 19 to fuse same, ceramic layer to ceramic layer, to form said laminate and
b) applying a thermomechanical sintering treatment to said laminate to fuse intermediate phases in the combined ceramic layers into c-axis oriented ceramic layers in said laminate, the corresponding layers of each composite being of the same or different compositions.

19. The composite of claims 14, 15 or 16, or the laminate of claims 17 or, 18, said composite or laminate having a ceramic layer that has a bulk metal cation composition of bismuth, lead, strontium, calcium and copper of the formula:

$$Bi_{2.00-x}Pb_xSr_{2.00\pm0.20}Ca_{1.00\pm0.15}Cu_{2.00\pm0.20},$$

where X is a value in the range of $0.00 \leq X \leq 0.40$.

20. The composite of claims 14, 15 or 16, or the laminate of claims 17 or 18, said composite or laminate having at least one ceramic layer that has a bulk metal cation composition of bismuth, lead, strontium, calcium and copper of the formula:

$$Bi_{2.00-x}Pb_xSr_{2.00\pm0.20}Ca_{1.00\pm0.15}Cu_{2.00\pm0.20},$$

where X is a value in the range of $0.00 \leq X \leq 0.40$ and where the ceramic layer of said formula is a c-axis textured superconducting layer.

21. The composite of claims 14, 15 or 16, or the laminate of claims 17 or 18, said composite or laminate having a ceramic layer that has a metal cation composition of bismuth, lead, strontium, calcium and copper of the formula:

$$Bi_{2.00-x}Pb_xSr_{2.00\pm0.20}Ca_{2.00\pm0.20}Cu_{3.00\pm0.30},$$

where X is a value in the range of $0.00 \leq X \leq 0.40$.

22. The composite of claims 14, 15 or 16, or the laminate of claims 17 or 18, said composite or laminate having at least one ceramic layer that has a metal cation composition of bismuth, lead, strontium, calcium and copper of the formula:

$$Bi_{2.00-x}Pb_xSr_{2.00\pm0.20}Ca_{2.00\pm0.20}Cu_{3.00\pm0.30},$$

where X is a value in the range of $0.00 \leq X \leq 0.40$ and wherein the ceramic layer of said formula is a c-axis textured superconducting layer.

23. The composite of claims 14, 15 or 16, or the laminate of claims 17 or 18, said composite or laminate having a ceramic layer that has a metal cation composition of bismuth, antimony, lead, strontium, calcium and copper of the formula:

$$(Bi_{1.00-Y}Sb_Y)_{2.00-x}Pb_xSr_{2.00\pm0.20}Ca_{2.00\pm0.20}Cu_{3.00\pm0.30},$$

where X is a value in the range of $0.00 \leq X \leq 0.40$ and Y is a value in the range of $0.00 \leq Y \leq 0.15$.

24. The composite of claims 14, 15 or 16, or the laminate of claims 17 or 18, said composite or laminate having at least one ceramic layer that has a metal cation composition of bismuth, antimony, lead, strontium, calcium and copper of the formula:

$$(Bi_{1.00-Y}Sb_Y)_{2.00-x}Pb_xSr_{2.00\pm0.20}Ca_{2.00\pm0.20}Cu_{3.00\pm0.20},$$

where X is a value in the range of $0.00 \leq X \leq 0.40$ and Y is a value in the range of $0.00 \leq Y \leq 0.15$ wherein the ceramic layer of said formula is a c-axis textured superconducting layer.

25. The composite of claims 14, 15 or 16, or the laminate of claims 17 or 18, said composite or laminate having a ceramic layer that has a metal cation composition of indium and tin that satisfies the formula:

$$In_2O_3 \cdot (X)SnO_2$$

where X is a value in the range of $0.01 \leq X \leq 0.50$ and the ceramic layer of said formula is electrically conducting.

26. The composite of claims 14, 15 or 16, or the laminate of claims 17 or 18, said composite or laminate further comprising a ceramic layer that has a metal cation composition of alkaline earth metals and aluminum that satisfies the formula:

$$AE_1Al_2O_4$$

where AE is an alkaline earth element or any mixture of magnesium (Mg), calcium (Ca), strontium (Sr), or barium (Ba), and the ceramic layer of said formula is an insulating spinel ceramic layer.

27. The composite of claims 14, 15 or 16, or the laminate of claims 17 or 18, said composite or laminate further comprising a ceramic layer that has a metal cation composition of iron and transition-metals satisfying:

$$TMFe_2O_4$$

where TM is a first-row transition-metal element having atomic numbers ranging between 21 and 30, and the ceramic layer of said formula is a magneto-sensitive normal spinel ceramic.

28. A composite of claims 14, 15 or 16, or the laminate of claims 17 or 18, said composite or laminate further comprising a ceramic layer that has a metal cation composition of rare earth elements and magnesium that satisfies the formula:

$$RE_2MgO_4$$

where RE is a rare earth metal element referring to yttrium (Y), or the lanthanide series of elements with atomic numbers ranging between 57 and 70, and the ceramic layer of said formula is a magneto-sensitive ceramic layer.

29. The composite of claims 14, 15 or 16, or the laminate of claims 17 or 18, said composite or laminate further comprising a ceramic layer that has a metal cation composition of magnesium, tin or first row transition-metals that satisfies the formulas:

$$FeMFeO_4$$

where M is magnesium (Mg) or a first row transition-metal element having atomic numbers ranging between 21 and 30, or:

$$ZnSnZnO_4$$

containing oxides of zinc (Zn) and tin (Sn), and the ceramic layer of one of said formulas is a magneto-sensitive inverse spinel ceramic layer.

30. The composite of claims 14, 15 or 16, or the laminate of claims 17 or 18, said composite or laminate further comprising a ceramic layer that has a metal cation composition of alkali elements and niobium that satisfies the formula:

$$(AL)_1NbO_3$$

where (AL) is a single alkali or a mixture of the following alkali elements: lithium (Li), sodium (Na) or potassium (K), and the ceramic layer of said formula is an insulating or piezoelectric ilmenite ceramic layer.

31. A method of splicing a laminate constructed according to one of claims 17 and 18, said laminate having at least two ceramic layers contained between two metallic layers, said method of splicing comprising, a) forming a first part of a splicing joint of said laminate so as to allow a first metallic layer which contacts a first ceramic layer to overhang the other ceramic and the other metallic layer;

b) forming the second part of said joint of said laminate so as to allow said other metallic layer which contacts said other ceramic layer to underhang said first ceramic layer and said first metallic layer and joining said first and second parts together.

32. A method of forming continuous surfaces by joining laminates of shorter dimension constructed according to one of claims 17 and 18 by splicing same.

33. The laminate of one of claims 17 and 18 having a plurality of edges and being bent around an axis to bring at least some of said edges together, which edges are spliced to define a tubular article.

34. A ceramic sputtering target comprising a layer selected from a thermomechanically calcined ceramic layer, a c-axis oriented ceramic layer and a compressed amorphous ceramic layer formed on a metallic substrate according to one of claims 15 and 16.

35. A heat shield comprising an assembly of
a) a thermally conductive metallic layer that dissipates heat to a thermal reservoir and
b) a thermally insulating ceramic layer formed on said metallic layer according to one of claims 15 and 16, to impede the transfer of heat across or through said assembly.

36. A device comprising a metal ceramic composite as an integral operating element, said metal ceramic composite having been constructed according to claim 16.

37. The composite of claim 16 wherein said ceramic layer and substrate are drawn out to elongated form to define a c-axis oriented ceramic filament.

38. A metal c-axis oriented ceramic composite assembly comprising one formed by,
a) selecting at least one c-axis oriented ceramic filament of claim 37,
b) preparing a preform by mechanically working said c-axis oriented ceramic filament into a desired shape in which the relative c-axis orientation of said ceramic filament is positioned at an angle with a transverse axis of said preform,
c) hermetically sealing said preform in a metal sheath,
d) extruding the hermetically sealed preform into a continuous sheet or an elongated wire and
e) heat treating said sheet or wire to further crystallize and orient at least one ceramic filament.

39. A device using a metal ceramic composite as an integral operating element, wherein said metal ceramic composite comprises a filament containing a c-axis oriented superconducting ceramic layer constructed according to claim 37, said device further comprising a component selected from the group consisting of,
an electrical conductor,
a magnetic solenoid,
an electromagnetic shield and
an energy storage device.

40. The device of claim 39 which includes at least one filament having a silver or silver alloy layer, c-axis oriented superconducting ceramic layer, and another metal layer that has intrinsic thermal conduction, thermal absorption, or mechanical properties that are different than the silver or silver alloy layer.

41. A device comprising a metal ceramic composite used as an integral operating element, said metal ceramic composite having a superconducting ceramic filament constructed according to claim 37.

42. The composite of claim 16 wherein said ceramic layer is sintered to further crystallize and c-orient same.

43. The composite formed according to any one of claims 14–16 and 42 wherein said ceramic layer has a metal cation composition selected from the group of alkaline earth elements, rare earth elements, lead, zirconium, titanium and tin or a combination thereof.

44. The composite formed according to any one of claims 14–16 and 42, said ceramic layer having a metal cation composition of alkaline earth elements, rare earth elements, lead, zirconium, titanium or tin that satisfies the formula:

$$(M_1)_1(M_2)_1O_3$$

where $M_1$ represents one or any mixture of alkaline earth elements, rare earth elements or lead, and $M_2$ represents zirconium (Zr), titanium (Ti), or tin (Sn), or any mixture of zirconium, titanium and tin, and the ceramic layer of said formula is an insulating, ferroelectric, or piezoelectric ceramic layer.

* * * * *

UNITED STATES PATENT AND TRADEMARK OFFICE
CERTIFICATE OF CORRECTION

PATENT NO. : 6,027,826

DATED : February 22, 2000

INVENTOR(S) : Pierre L. deRochemont, et al.

It is certified that error appears in the above-identified patent and that said Letters Patent is hereby corrected as shown below:

Column 24, line 28, change "article" to --articles--.

Signed and Sealed this

Twentieth Day of June, 2000

Attest:

Q. TODD DICKINSON

*Attesting Officer*    *Director of Patents and Trademarks*